(12) United States Patent
Barr et al.

(10) Patent No.: US 11,545,589 B2
(45) Date of Patent: Jan. 3, 2023

(54) SINGLE CELL PHOTOVOLTAIC MODULE

(71) Applicant: UBIQUITOUS ENERGY, INC., Redwood City, CA (US)

(72) Inventors: Miles Barr, Redwood City, CA (US); Ian Millard, Palo Alto, CA (US); Rachel Molaro, Redwood City, CA (US); Richa Pandey, Santa Clara, CA (US)

(73) Assignee: UBIQUITOUS ENERGY, INC., Redwood City, CA (US)

( * ) Notice: Subject to any disclaimer, the term of this patent is extended or adjusted under 35 U.S.C. 154(b) by 0 days.

(21) Appl. No.: 16/937,434

(22) Filed: Jul. 23, 2020

(65) Prior Publication Data
US 2021/0013353 A1    Jan. 14, 2021

Related U.S. Application Data

(63) Continuation of application No. 15/816,939, filed on Nov. 17, 2017, now Pat. No. 10,741,713.
(Continued)

(51) Int. Cl.
*H01L 31/05* (2014.01)
*H01L 31/043* (2014.01)
(Continued)

(52) U.S. Cl.
CPC ...... *H01L 31/0508* (2013.01); *H01L 31/0201* (2013.01); *H01L 31/022466* (2013.01);
(Continued)

(58) Field of Classification Search
CPC ............... H01L 31/0508; H01L 31/043; H01L 31/0468; H01L 31/0201; H01L 31/022466;
(Continued)

(56) References Cited

U.S. PATENT DOCUMENTS 10,741,713 B2   8/2020   Barr et al.
2002/0044331 A1*  4/2002  Agrawal ............ H01M 14/005
                                                  359/265
(Continued)

FOREIGN PATENT DOCUMENTS

CN    105378940 A    3/2016
JP    2003178817 A   6/2003
(Continued)

OTHER PUBLICATIONS

In Compliance Magazine, Electronic Design, Testing and Standards, Zebra Connectors for LCDs, (https://www.https://incompliancemag.com/zebra-connectors-for-lcds/; downloaded Jun. 25, 2021), p. 1 (Year: 2015).*
(Continued)

*Primary Examiner* — Jayne L Mershon
(74) *Attorney, Agent, or Firm* — Kilpatrick Townsend & Stockton LLP

(57) ABSTRACT

A photovoltaic module includes a first transparent electrode layer characterized by a first sheet resistance, a second transparent electrode layer, and a photovoltaic material layer. The photovoltaic material layer is located between the first transparent electrode layer and the second transparent electrode layer. The photovoltaic module also includes a first busbar having a second sheet resistance lower than the first sheet resistance. The first transparent electrode layer, the second transparent electrode layer, and the photovoltaic material layer have an aligned region that forms a central transparent area of the photovoltaic module. The central transparent area including a plurality of sides. The first busbar is in contact with the first transparent electrode layer adjacent to at least a portion of each of the plurality of sides of the central transparent area.

14 Claims, 27 Drawing Sheets

Related U.S. Application Data

(60) Provisional application No. 62/423,581, filed on Nov. 17, 2016.

(51) Int. Cl.
*H01L 31/042* (2014.01)
*H01L 31/0468* (2014.01)
*H01L 31/02* (2006.01)
*H01L 31/0224* (2006.01)
*H01L 31/12* (2006.01)

(52) U.S. Cl.
CPC ............ *H01L 31/022475* (2013.01); *H01L 31/022483* (2013.01); *H01L 31/042* (2013.01); *H01L 31/043* (2014.12); *H01L 31/0468* (2014.12); *H01L 31/0516* (2013.01); *H01L 31/12* (2013.01); *Y02E 10/50* (2013.01)

(58) Field of Classification Search
CPC ..... H01L 31/022475; H01L 31/022483; H01L 31/042; H01L 31/0516; H01L 31/12
See application file for complete search history.

(56) References Cited

U.S. PATENT DOCUMENTS

| | | |
|---|---|---|
| 2003/0189402 A1 | 10/2003 | Gaudiana et al. |
| 2007/0065962 A1* | 3/2007 | Pichler .............. H01L 31/02167 438/47 |
| 2008/0092942 A1 | 4/2008 | Kinsey et al. |
| 2010/0012167 A1 | 1/2010 | Milshtein et al. |
| 2011/0259395 A1 | 10/2011 | Wieting et al. |
| 2014/0102531 A1* | 4/2014 | Moslehi .......... H01L 31/022458 136/256 |
| 2014/0159032 A1* | 6/2014 | Syllaios .............. H01L 31/0376 257/43 |
| 2014/0311565 A1 | 10/2014 | Bae |
| 2014/0352767 A1 | 12/2014 | Lee |
| 2016/0126407 A1 | 5/2016 | Cardi et al. |
| 2016/0204303 A1 | 7/2016 | Prabhu et al. |
| 2016/0240697 A1 | 8/2016 | Sung |
| 2016/0343966 A1 | 11/2016 | Forrest et al. |

FOREIGN PATENT DOCUMENTS

| | | |
|---|---|---|
| JP | 2007265796 A | 10/2007 |
| JP | 2009049278 A | 3/2009 |
| JP | 2014135319 A | 7/2014 |
| WO | 2015109069 A1 | 7/2015 |
| WO | 2015154088 A1 | 10/2015 |
| WO | 2018094259 A1 | 5/2018 |

OTHER PUBLICATIONS

KR10-2019-7017377, "Notice of Decision to Grant", dated Mar. 4, 2021, 3 pages.
EP17872345.8, "Extended European Search Report", dated Aug. 28, 2020, 11 pages.
EP17872345.8, "Partial Supplementary European Search Report", dated May 27, 2020, 11 pages.
JP2019-526225, "Office Action", dated Aug. 11, 2020, 9 pages.
KR10-2019-7017377, "Office Action", dated Sep. 22, 2020, 7 pages.
PCT/US2017/062384, "International Preliminary Report on Patentability", dated May 31, 2019, 11 pages.
PCT/US2017/062384, "International Search Report and Written Opinion", dated Jan. 30, 2018, 12 pages.
JP2019-526225, "Office Action", dated May 14, 2021, 8 pages.
EP17872345.8, "Office Action", dated Mar. 16, 2022, 6 pages.
CN2017800835671, "Notice of Decision to Grant", dated May 7, 2022, 6 pages.

* cited by examiner

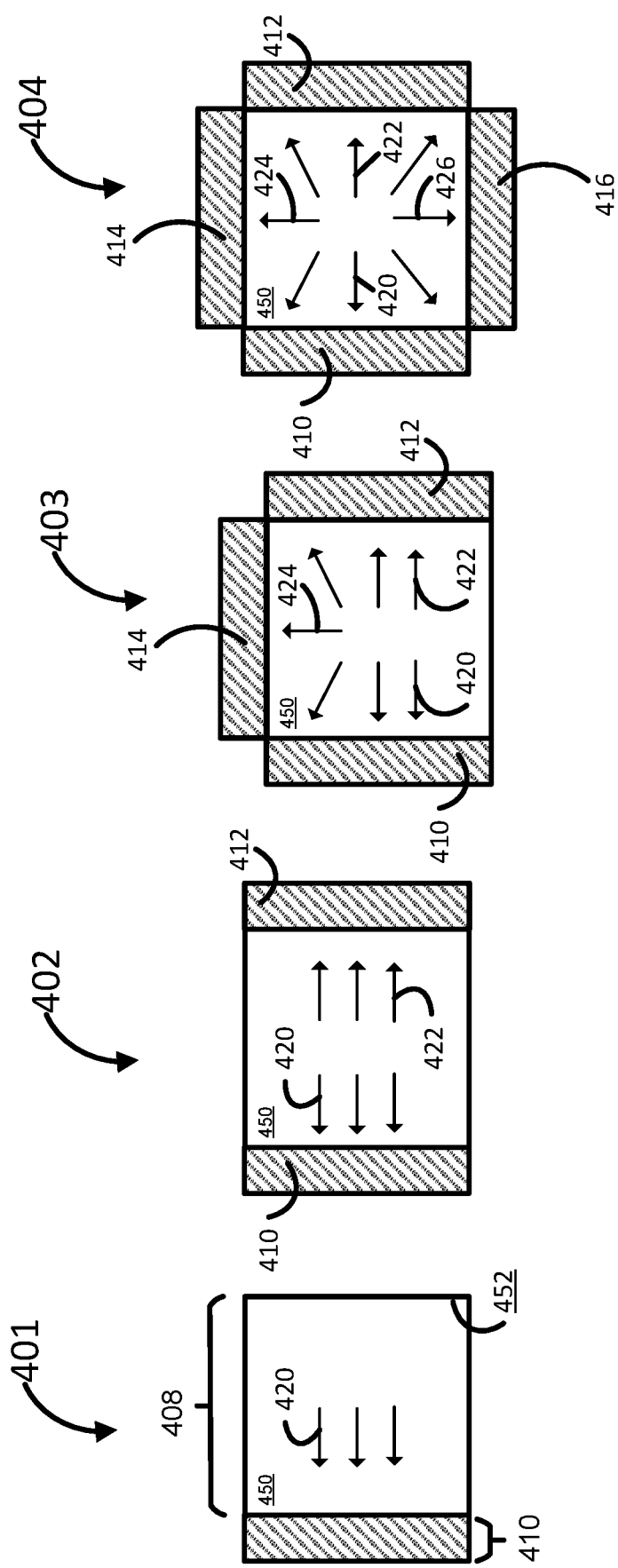

| Configuration | Sum Point Distances for Configuration / Sum Point Distances for 1-side | Schematic of configuration |
|---|---|---|
| 1-side | 1.000 | |
| 2-side | 0.500 | |
| 3-side | 0.417 | |
| 4-side | 0.333 | |

FIG. 5

| Configuration | Sum Point Distances for Configuration / Sum Point Distances for 1-contact on either side | 3 |
|---|---|---|
| 1 contact on either side | 1.0 | |
| Corner contacts | 0.67 | |
| C-shape contacts | 0.55 | |

FIG. 7

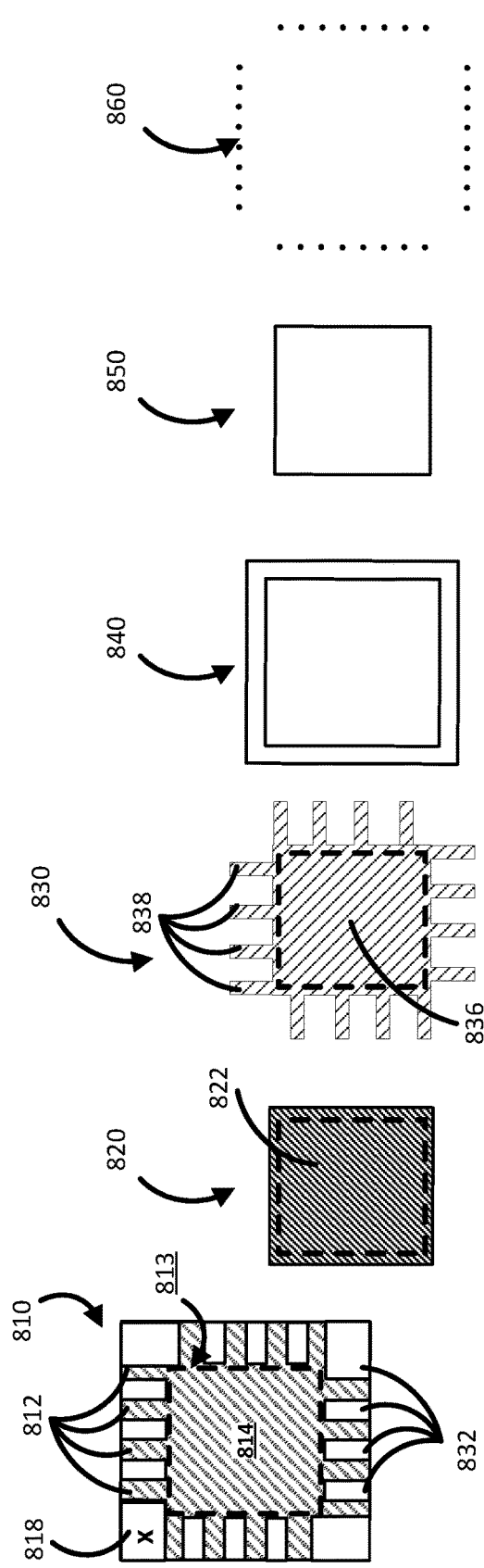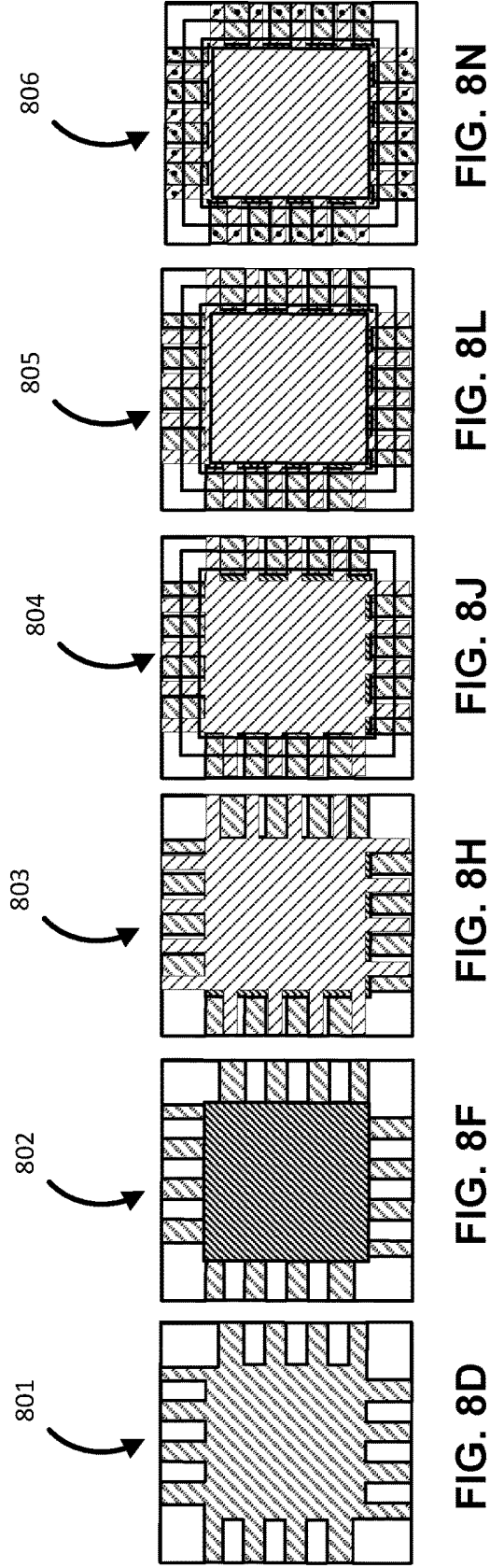

| Configuration | Sum Point Distances for Configuration/Sum Point Distances for 0.25-contact per side | |
|---|---|---|
| 0.25-contact per side (left side bottom electrode, right side top electrode) | 1.000 |  |
| 0.5-contact per side | 0.645 |  |
| 1-contact per side | 0.471 |  |
| 2-contact per side | 0.371 |  |
| 3-contact per side | 0.333 |  |
| 4-contact per side | 0.315 |  |
| 5-contact per side | 0.305 |  |
| 6-contact per side | 0.299 |  |
| 7-contact per side | 0.295 |  |
| 8-contact per side | 0.292 |  |
| 10-contact per side | 0.289 | |
| 50-contact per side | 0.281 | |
| Full perimeter contact for both electrodes | 0.281 | |

FIG. 9

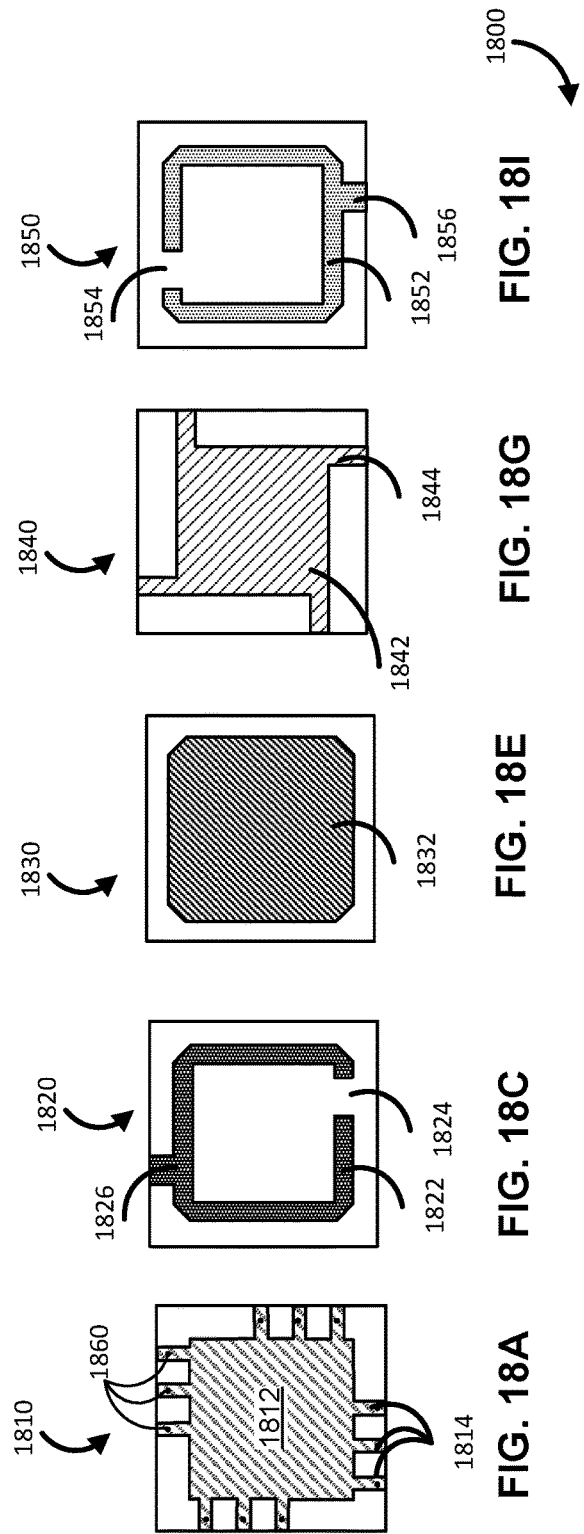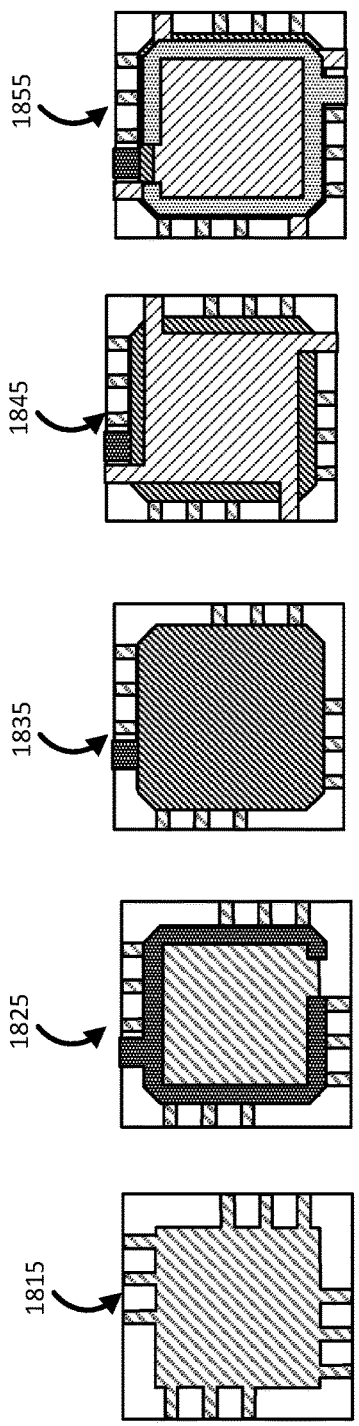

|  | 2 junctions | | 4 junctions | | 6 junctions | | 8 junctions | | 10 junctions | |
| --- | --- | --- | --- | --- | --- | --- | --- | --- | --- | --- |
|  | 2.5cm² | 0.05cm² | 2.5cm² | 0.05cm² | 2.5cm² | 0.05cm² | 2.5cm² | 0.05cm² | 2.5cm² | 0.05cm² |
| Max Jsc (mA/cm²) | 2.31 | 2.38 | 1.44 | 1.48 | 0.93 | 0.97 | 0.65 | 0.67 | 0.46 | 0.48 |
| Max Voc (V) | 1.65 | 1.58 | 3.22 | 3.08 | 4.74 | 4.54 | 6.25 | 5.97 | 7.70 | 7.34 |
| Max FF | 0.54 | 0.59 | 0.57 | 0.61 | 0.59 | 0.62 | 0.62 | 0.65 | 0.63 | 0.65 |
| Max Efficiency (%) | 2.06 | 2.18 | 2.66 | 2.75 | 2.61 | 2.73 | 2.49 | 2.57 | 2.23 | 2.25 |
| Average Jsc (mA/cm²) | 2.30 | 2.36 | 1.43 | 1.47 | 0.93 | 0.96 | 0.64 | 0.66 | 0.46 | 0.48 |
| Average Voc (V) | 1.65 | 1.56 | 3.21 | 3.04 | 4.73 | 4.48 | 6.24 | 5.89 | 7.69 | 7.25 |
| Average FF | 0.54 | 0.57 | 0.57 | 0.60 | 0.59 | 0.61 | 0.62 | 0.64 | 0.63 | 0.64 |
| Average Efficiency (%) | 2.05 | 2.13 | 2.64 | 2.71 | 2.59 | 2.68 | 2.48 | 2.53 | 2.20 | 2.21 |

FIG. 20F

SINGLE CELL PHOTOVOLTAIC MODULE

CROSS-REFERENCES TO RELATED APPLICATIONS

This application is a continuation of U.S. application Ser. No. 15/816,939, filed Nov. 17, 2017, which claims priority to U.S. Provisional Patent Application No. 62/423,581, filed Nov. 17, 2016. The disclosures of which are hereby incorporated by reference in their entirety for all purposes.

FIELD OF THE INVENTION

This invention relates to the field of photovoltaic modules and devices and more particularly, single cell photovoltaic modules.

BACKGROUND OF THE INVENTION

Photovoltaic (PV) cells with partial light transmission have been developed to provide electrical power for a variety of applications, including windows, mobile devices, and information displays. However, there is a need in the art for improved methods and systems related to PV modules.

SUMMARY OF THE INVENTION

Embodiment described herein relate to photovoltaic modules with low power loss caused by series resistance. A single cell transparent photovoltaic module with minimized visible patterns and minimized power loss from series resistance is disclosed. The photovoltaic module can include a first and second transparent electrode that each have a continuous central area and a periphery with a photovoltaic material positioned between the first and second transparent electrodes. Each transparent electrode can be contacted by a low-resistance electrical busbar in contact with each side of the periphery to minimize the distance of current travel. In some embodiments current travel is minimized by making electrical contact to interdigitated contact points on the top and bottom electrode adjacent to the periphery. The transparent photovoltaic module can be integrated into various applications such as being overlaid onto an information display to provide electrical power to the device.

In some embodiments, a single cell photovoltaic module may include a transparent bottom electrode layer, an active layer, and a transparent top electrode layer. In certain embodiments, a top busbar having a sheet resistance lower than the sheet resistance of the top electrode layer may be in contact with the full or near full periphery of the top electrode layer to reduce the series resistance associated with the top electrode layer. Additionally or alternatively, a bottom busbar having a sheet resistance lower than the sheet resistance of the bottom electrode layer may be in contact with the full or near full periphery of the bottom electrode layer to reduce the series resistance associated with the bottom electrode layer. In some embodiments, the top electrode layer (or the top busbar) may be connected to a first set of contact pads, the bottom electrode layer (or the bottom busbar) may include or be connected to a second set of contact pads, and the first set of contact pads may be arranged interdigitatedly with respect to the second set of contact pads. In some embodiments, a cell of the photovoltaic module may include multiple junctions connected in series to increase the output voltage while limiting the output current of the cell, such that power loss caused by the series resistance may be limited as well. In various implementations, these and other techniques disclosed herein may be used individually or in combination.

According to an embodiment of the present invention, a photovoltaic module is provided. The photovoltaic module includes a first transparent electrode layer characterized by a first sheet resistance, a second transparent electrode layer, and a photovoltaic material layer. The photovoltaic material layer is located between the first transparent electrode layer and the second transparent electrode layer. The photovoltaic module also includes a first busbar having a second sheet resistance lower than the first sheet resistance. The first transparent electrode layer, the second transparent electrode layer, and the photovoltaic material layer have an aligned region that forms a central transparent area of the photovoltaic module. The central transparent area includes a plurality of sides. The first busbar is in contact with the first transparent electrode layer adjacent at least a portion of each of the plurality of sides of the central transparent area. In another embodiment, the first busbar is in contact (e.g., electrical contact) with the first transparent electrode layer adjacent at least a portion of each of two or more of the plurality of sides of the central transparent area.

In an embodiment, the first busbar is in contact with the first transparent electrode layer at a plurality of contact locations on each of the plurality of sides of the central transparent area. In another embodiment, the photovoltaic module also includes a contact pad located proximal to the second transparent electrode layer. The first busbar is electrically coupled to the contact pad. In yet another embodiment, the photovoltaic module additionally includes a plurality of contact pads located proximal to the second transparent electrode layer. The first busbar is electrically coupled to one or more of the plurality of contact pads. In yet another embodiment, the photovoltaic module includes a first set of contact pads located proximal to the second transparent electrode layer, the first set of contact pads coupled to the first busbar and a second set of contact pads located proximal to the second transparent electrode layer. The second set of contact pads are coupled to the second busbar and the first set of contact pads is arranged interdigitatedly relative to the second set of contact pads.

According to another embodiment of the present invention, a photovoltaic module is provided. The photovoltaic module includes a first transparent electrode layer including a contiguous first central region and a first set of electrode pads electrically coupled to the contiguous first central region. The photovoltaic module also includes a second transparent electrode layer including a contiguous second central region and a second set of electrode pads electrically coupled to the contiguous second central region. The photovoltaic module further includes a photovoltaic material layer located between the first transparent electrode layer and the second transparent electrode layer. The contiguous first central region, the contiguous second central region, and the photovoltaic material layer are aligned to form a central transparent area of the photovoltaic module, the central transparent area including a plurality of sides. At least one of the first set of electrode pads and at least one of the second set of electrode pads are positioned on each of the plurality of sides of the central transparent area.

According to a specific embodiment of the present invention, a photovoltaic module is provided. The photovoltaic module includes a first transparent electrode layer including a contiguous first central region and a first set of electrode pads electrically coupled to the contiguous first central region. The photovoltaic module also includes a second transparent electrode layer including a contiguous second central region and a second set of electrode pads electrically coupled to the contiguous second central region. The photovoltaic module further includes a photovoltaic material layer located between the first transparent electrode layer and the second transparent electrode layer. The contiguous first central region, the contiguous second central region, and the photovoltaic material layer are aligned to form a central transparent area of the photovoltaic module, the central transparent area having a perimeter that includes a plurality of segments. At least one of the first set of electrode pads and at least one of the second set of electrode pads are positioned on each segment of the plurality of segments of the perimeter of the central transparent area.

Numerous benefits are achieved by way of the present invention over conventional techniques. For example, embodiments of the present invention provide single cell transparent photovoltaic modules with reduced visible patterns and reduced power loss from series resistance. In some embodiments current travel is reduced in comparison with conventional designs by making electrical contact to interdigitated contact points on the top and bottom electrode adjacent to the periphery. These and other embodiments of the invention along with many of its advantages and features are described in more detail in conjunction with the text below and attached figures.

BRIEF DESCRIPTION OF THE DRAWINGS

FIGS. 4A-D show the direction of charge travel in a single cell module with an increasing number of contacts;

FIG. 5 shows a table with dimensionless ratios of charge travel distances for different perimeter contact configurations;

FIG. 7 shows dimensionless ratios of charge travel distances for different two-contact configurations of a single cell module;

FIGS. 8C-8N show a breakout of each layer of a single cell module according to an embodiment of the present invention;

FIG. 9 shows dimensionless ratios of charge travel distances for different interdigitated contact configurations;

FIGS. 18A-18J show a breakout of each layer of an example single cell module with busbars providing near full perimeter contact with an electrode layer according to an embodiment of the present invention;

FIG. 20F is a table showing performance parameters of the example multi junction cell modules with different numbers of junctions and cell areas.

DETAILED DESCRIPTION OF THE INVENTION

Figure 1A:
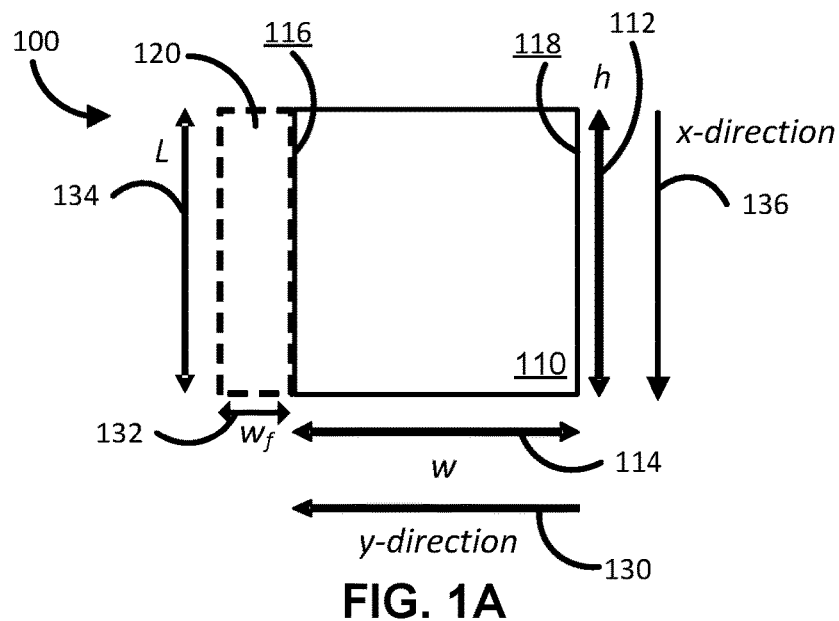
FIG. 1A shows a schematic of an active area of a photovoltaic cell according to an embodiment of the present invention.

The inventors have determined that transparent electrode layers generally have a higher sheet resistance than non-transparent electrodes. The addition of series resistance in photovoltaic (PV) modules may cause a higher power loss and may significantly reduce the overall efficiency of the PV modules. In conventional PV technologies, the reduction of series resistance is of significant importance to obtaining the highest performance and is achieved through a number of approaches that include, but are not limited to, patterning the module into subcells with optimized dimensions, use of highly conductive opaque conductive electrodes, and the deposition of highly conductive bus bars over the module area. These optimizations enable conventional technologies to limit series resistance but different processes and methodologies must be used when fabricating transparent photovoltaic modules, in particular, PV modules with large active areas (and thus large series resistance). Accordingly, embodiments of the present invention reduce the series resistance of the PV modules or otherwise reduce power loss to improve the overall efficiency of the PV modules.

As used herein, the term transparent means at least partial transmission of visible light. In general, power output of transparent PV modules can be reduced by the introduction of an additional series resistance. Such series resistance can arise from the inherent sheet resistance of transparent electrodes that are necessary in transparent PV modules and modules to allow light transmission into the photoactive semiconductors and also transmission through the module itself. Conventional PV technologies reduce the series resistance through highly conductive opaque metal electrodes, highly conductive opaque busbars over the module area, and patterning the module into subcells with optimized dimensions to reduce the operating current. Application of opaque electrodes and patterned opaque metal busbars to a transparent module area causes a tradeoff between good aesthetics (transparency) and performance (higher series resistance) and these approaches are less desirable for transparent PV modules. Further, transparent PV modules typically use electrode materials that have a higher resistance than conventional opaque materials resulting in a tradeoff in increasing the module area with increasing the series resistance (reduced module performance).

Finally, patterning the module area into sub cells can lead to visual features that may be undesirable for transparent PV modules. The modules discussed herein utilize alternative approaches to reducing or minimizing series resistance additions and module efficiency losses for transparent PV modules when good aesthetics are required and two transparent electrodes must be employed. Such modules can be used in a variety of applications including rigid and flexible computer display screens used in a desktop monitor, laptop or notebook computer, tablet computer, mobile phone, e-readers, and the like. Other applications include watch faces, automotive and architectural glass including sunroofs and privacy glass. The photovoltaic modules may be used for active power generation, e.g., for completely self-powered applications, and battery charging (or battery life extension).

The embodiments described herein use various PV arrangements including electrodes, busbars, and contacts. In some embodiments, electrodes can be electrical conductors used to make contact with a nonmetallic part of a circuit. The electrode can form part of an active area of a module and can extend outside of the active area to connect with a busbar or various types of contacts. In some embodiments, electrodes can have a higher resistance than busbars and/or contacts. Sheet resistances of electrodes can be in the mΩ/sq range for opaque electrodes and range from 1 Ω/sq-100 Ω/sq for transparent electrodes. Electrodes can be fabricated using physical vapor deposition (PVD) techniques such as thermal evaporation, electron beam physical vapor deposition (EBPV), sputter deposition, or the like. Opaque electrode embodiments can include metals such as aluminum, silver, or gold, which can be deposited by PVD, generally ranging from 20 nm-300 nm in thickness. In some embodiments, transparent electrodes can be fabricated by PVI) and include thin metal layers such as aluminum, silver, or gold (4 nm-12 nm) coupled with organic (e.g. small molecules) or inorganic dielectric layers (e.g., metal oxides) over a wide range of thicknesses (1 nm-300 nm) to improve optical transmission. Transparent electrodes can also be fabricated by PVD of conductive oxide materials such as indium tin oxide (ITO), aluminum zinc oxide (AZO), antimony tin oxide (ATO), fluorine tin oxide (FTO), and indium zinc oxide (IZO). Transparent electrodes can also be made from different metal nanostructures such as silver nanowires and nano-cluster that can be deposited using a variety of solution-deposition techniques (spin-coating, blade-coating, spray-coating). Transparent electrodes may also be made from graphene or carbon nanotube layers. Metals can be structures or patterned to form porous grid or network structures to make transparent electrodes.

In some embodiments, busbars can be conductors that provide pathways to transport current between electrodes and contacts. Busbars can be a metallic bar or strip and can also be deposited and patterned to form different pathway patterns. In some embodiments, busbars can be opaque and reside outside of the active area of the module. Busbars can have lower resistance than electrodes and higher resistance than contact components. Busbars can be fabricated from various materials, including, for example thin metal layers of Ag or Al, conductive silver pastes or epoxies, and the like. Resistance through busbars can depend on the material, the material thickness, and the lateral layout and dimensions of the busbar (e.g., width and length of busbar between electrode and contact point). In some embodiments, busbar can include metal film layers of silver, aluminum, gold, copper, or other highly conductive metals deposited using different PVD techniques, with thicknesses over 100 nm to lower resistance. Busbars can be fabricated using conductive pastes or epoxies, which can be an emulsion of silver in solvent or an epoxy medium. Conductive pastes or epoxies can be patterned manually or using techniques such as ink jet printing or screen printing. Substrates may be pre-printed with patterned busbars or busbars may be added during or after the other PV module layers.

In some embodiments, as discussed further below, the busbars and or electrode 450 can be in electrically coupled to one or more contacts. Contacts can refer to the points on a PV module where electrical connection is made between the module's electrodes or busbars to an outside circuit. Contacts to a module can be temporary, semi-permanent, or permanent. In some embodiments contact components, such as wires, pins, ZEBRA connectors, etc. can be very low resistance (<1Ω, preferably in the mΩ range across the length of the component). Resistance can depend on the type of connector and the dimension (e.g. the length of a wire or the conductive material in a ZEBRA connector). Contacts can be connected to electrodes or busbars and transport charge to circuits or other components used to connect the module for testing or powering a load.

In various embodiments of the present invention there are many potential points for reducing charge loss in a PV module. In certain embodiments, the design, the materials, the configurations, and the components can be varied to minimize different resistance losses. In general, the following resistance losses can be considered: losses from top and bottom electrode resistance, losses from electrode to busbar or electrode to contact resistance, losses from busbar resistance, losses from busbar to contact resistance, losses from contact components, and losses from other electrical connections and components.

According to embodiments of the present invention, the contact resistance between electrode to busbar/contact or busbar to contact can be relatively small. Losses in contact components and other electrical components can be negligible in comparison to electrode and busbar resistances. In some embodiments, the primary resistive loss can be from an electrode resistance, followed by a busbar resistance. The power loss from resistance can depend on the electrode and busbar electrical properties as well as the dimensions and geometry of the cell and contact layout.

FIG. 1A shows a schematic of an active area of a photovoltaic cell according to an embodiment of the present invention. The photovoltaic cell 100 can be used to illustrate the relationships between module parameters and power loss for a single cell with simple contact configurations. The photovoltaic cell 100 includes an active area 110 with a height, h, 112 and a width, w, 114. The active area can include one or more electrodes, one or more active layers, and one or more interconnects in a tandem structure. In some embodiments, one or more electrodes can be transparent. The photovoltaic cell 100 also includes a first busbar 120 along a first side 116 of the active area 110. In the illustrated embodiment, the power loss from sheet resistance of an electrode can generally be calculated starting with Equation (1), the general formula for power loss:

$$P_{loss} = I^2 R \quad (1)$$

Current is generated throughout the cell active area 110. Resistive losses will not be equal for all charge generated because charge is generated at different distances away from the first busbar 120. Equations (2-5) integrate the power loss over y 130 to relate power loss to the width 114 of the active area 110.

$$dP_{loss} = I^2 dR \quad (2)$$

$$dR = \frac{\rho}{h} dy \quad (3)$$

$$I(y) = Jhy \quad (4)$$

$$P_{loss} = \int I(y)^2 dR = \int_0^w \frac{J^2 h^2 y^2 \rho dy}{h} = \frac{J^2 h \rho w^3}{3}, \quad (5)$$

where ρ is the resistivity of the electrode.

The power generated by the photovoltaic cell 100 can be calculated using Equation (6):

$$P_{gen} = J_{MP} w h V_{MP}, \quad (6)$$

where $J_{MP}$ is the current density at the maximum power point and $V_{MP}$ is the voltage at the maximum power point.

The percentage of power loss is then the lost power divided by the generated power:

$$P_{\% \, loss} = \frac{P_{loss}}{P_{gen}} = \frac{\rho w^2 J_{MP}}{3 V_{MP}}. \quad (7)$$

Sheet resistance (Rsh) of the electrode is directly proportional to resistivity of the electrode and can be used as a metric for characterizing electrodes. In other embodiments resistivity can be used as a metric for characterizing electrodes. In some embodiments, an attached circuit can control the voltage and/or current to operate at the maximum power point. Operating the photovoltaic cell current and voltages at the appropriate levels can maximize power extraction under all conditions.

The changes to various module properties can affect power loss in the photovoltaic cell 100. For example, as shown in Equation (7), the percent power loss scales with the square of the cell width, linearly with the current, and inversely with the voltage. Some embodiments implement a photovoltaic cell design with low current and high voltage to minimize performance drop in large photovoltaic cells 100.

Figure 1B:
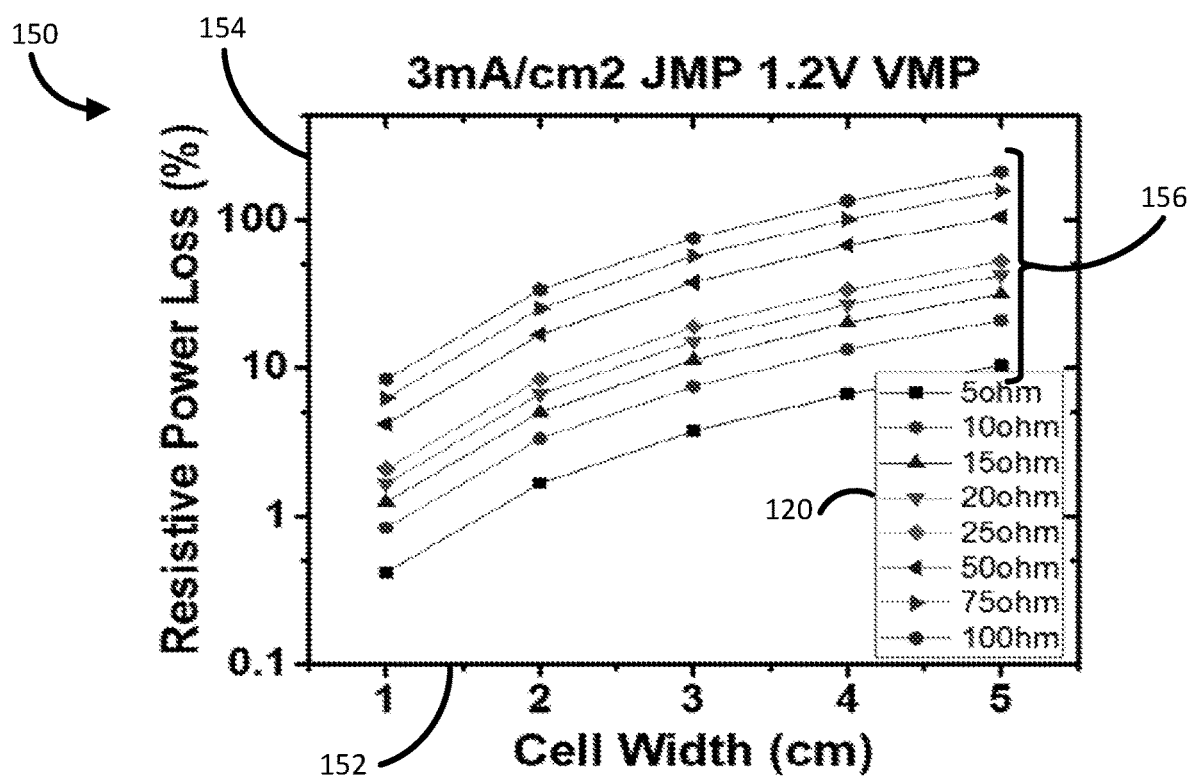
FIG. 1B shows the effect of active area sheet resistance on resistive power loss.

FIG. 1B shows the effect of active area sheet resistance on resistive power loss. The results illustrated in FIG. 1B are based on an assumed current density at maximum power point, $J_{MP}$, of 3 mA/cm² and $V_{MP}$ of 1.2 V. The x-axis 152 represents cell width w 114. The y-axis 154 represents the resistive power loss percentage. The plot 150 includes a plurality of curves 156, each curve associated with a different sheet resistance value in Ω/sq. The value associated with each curve is summarized in the legend 158. FIG. 1B illustrates that without modification, as the width w 114 of the photovoltaic cell 100 increases, resistive power losses will continue to increase.

In some embodiments, sheet resistance of a transparent electrode can be the limiting factor in module area scaling. Embodiments of the present invention utilize transparent electrodes that provide a combination of high conductivity (i.e., low sheet resistance) and low absorptive loss (i.e., low absorption coefficient).

Starting with the general formula for power loss, Equation (8) provides that:

$$P_{loss-busbar} = I^2 R \quad (8)$$

If all the charge generated is being transported by a busbar 120 to a contact point on either end, the power losses in the busbar can be calculated by integrating over the length L in the x-direction 136:

$$dP_{loss-busbar} = I^2 dR \quad (9)$$

$$dR = \frac{\rho_{busbar}}{w_f} dx \quad (10)$$

$$I(x) = Jwx \quad (11)$$

$$P_{loss-busbar} = \int I(x)^2 dR = \int_0^L \frac{J^2 w^2 x^2 \rho_{busbar} dx}{w_f} = \frac{\rho_{busbar} J^2 w^2 L^3}{3 w_f} \quad (12)$$

The total generated power can be calculated as:

$$P_{gen-busbar} = J_{MP} w L V_{MP} \quad (13)$$

and the percentage of power loss $P_{\% \, loss-busbar}$ is then the lost power, $P_{loss-busbar}$ divided by the generated power, $P_{gen-busbar}$:

$$P_{\%\ loss-busbar} = \frac{P_{loss-busbar}}{P_{gen-busbar}} = \frac{\rho_{busbar} J_{MP} w L^2}{3 w_f V_{MP}} \quad (14)$$

Equation (14) shows that power loss is directly proportional to busbar length L 134 squared and the current, $J_{MP}$. The power loss is inversely proportional to the voltage. Some embodiments can be configured to operate with low current and high voltage to minimize performance loss due to electrode resistance. In some embodiments, busbars will be made from low resistance materials that result in a negligible power loss in comparison to losses attributed to module electrode resistance.

In some embodiments, a second busbar (not illustrated) can be fabricated on another edge of the active area 110. In particular embodiments, the second busbar can be in electrical contact with a second side 118 of the active area 110 opposite to the first side 116. In this embodiment, the maximum width that a charge must travel becomes halved and results in an effective width of w/2. Substituting the effective width of a two busbar photovoltaic cell 100 for w in the result of Equation (5) causes the power loss over the active area 110 to become:

$$P_{loss} = \int I(y)^2 dR = \int_0^w \frac{J^2 h^2 y^2 \rho dy}{h} = \frac{J^2 h \rho w^3}{3} \to \frac{J^2 h \rho w^3}{24} \quad (15)$$

The reduced charge travel distance results in a decrease in the power loss due to electrode resistance. The source of the decreased power loss is the increased denominator as a result of the effective width, w/2, in the last step of Equation (15). Accordingly, in a two busbar photovoltaic cell the percent power loss becomes:

$$P_{\%\ loss} = \frac{P_{loss}}{P_{gen}} = \frac{\rho w^2 J_{MP}}{3 V_{MP}} \to \frac{\rho w^2 J_{MP}}{12 V_{MP}}. \quad (16)$$

Thus, the percent power loss in a two busbar configuration is reduced to 25% of the power loss shown in Equation (7). As described herein, various embodiments of the present invention reduce the charge travel distance to reduce the percent power loss accordingly.

In conventional PVs, the back electrode is typical an opaque highly conductive metallic electrode. However, transparent PV embodiments require both the top and bottom electrode to be transparent, and highly conductive metal electrode cannot typically be used. Due to the increased sheet resistance of transparent electrodes compared to opaque metal electrodes, this can increase resistive power losses observed for transparent PVs.

One approach to minimize the impact of increased sheet resistance from the transparent electrodes is to incorporate metallic busbars over the active area. These can be printed to cover portions of the active module area, but can create visible line features that change the viewing appearance and reduce the overall transmission through the module. Typical arrangements of metal grids within the active area can include macroscopically defined busbar arrays defined over a few centimeters, smaller grid arrays defined as either hexagonal or striped, and the like. In all cases the grid array obstructs the field of view.

A second approach to minimizing power loss is to subdivide the module area into a series-integrated sub cells. Subdividing the module area reduces the charge travel distance in each cell, and series integration allows the PV to run at a low current (that of a single sub cell) and a high voltage (summation of sub cell voltages) to help minimizing resistive power losses. Each sub-cell comprises a top electrode, an active layer, and a bottom electrode.

Figure 2A:
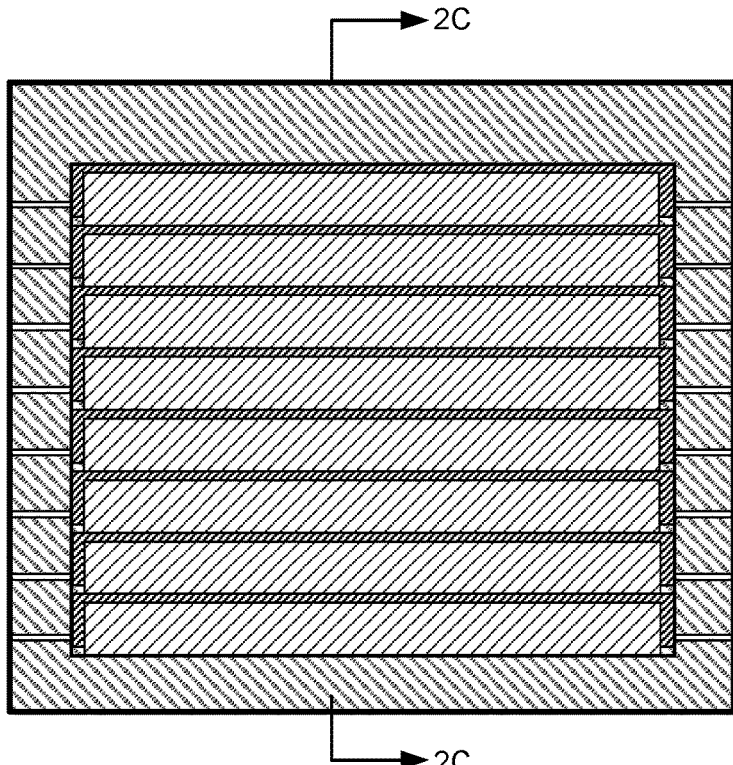
FIG. 2A shows a monolithic series integrated solar cell with 8 sub-cells in series.
Figure 2B:
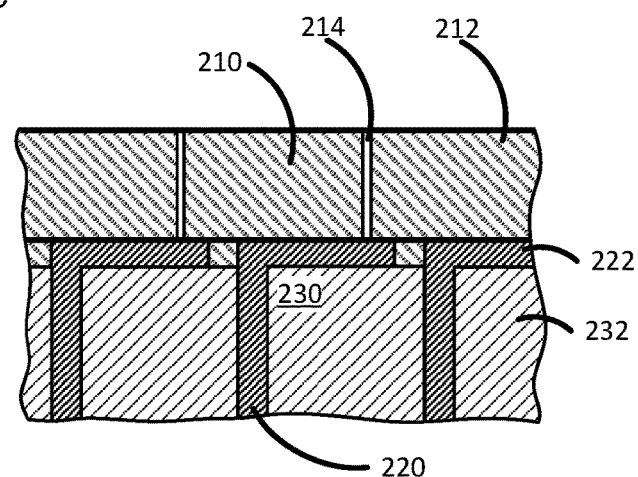
FIG. 2B shows an expanded plan view of a portion of the monolithic series integrated solar cell illustrated in FIG. 2A.

FIG. 2A shows an example of a monolithic series integrated solar cell 200 with 8 sub-cells in series. FIG. 2B shows an expanded plan view of a portion of the monolithic series integrated solar cell illustrated in FIG. 2A. In FIG. 2B, a first bottom electrode 210 separated from a second bottom electrode 212 by an electrical isolation line 214 are shown. In some embodiments, one or more of the first and second bottom electrodes can be a highly conductive metallic electrode. Each bottom electrode is in electrical contact with an active layer. In some embodiments the photovoltaic material active layer can be composed of cadmium telluride, silicon, organic semiconductors, and the like. In FIG. 2B, the first bottom electrode 210 is in electrical contact with a first active layer 220 and the second bottom electrode 212 is in electrical contact with a second active layer 222. Each cell can include a top electrode in electrical contact with an active layer. In FIG. 2B, the first active layer 220 can be in electrical contact with a first top electrode 230 and the second active layer 222 can in electrical contact with a second top electrode 232.

Figure 2C:
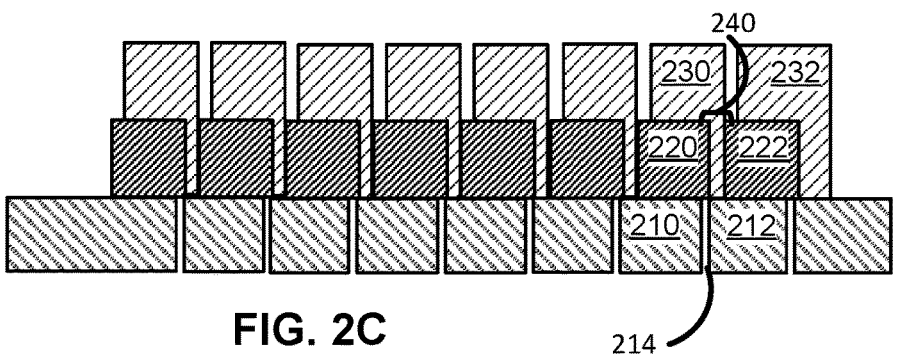
FIG. 2C is a cross-sectional view of the monolithic series integrated solar cell at line 2C in FIG. 2A.

FIG. 2C shows a cross-section of the architecture at line 2C in FIG. 2A. The cross-section view shows how the individual cells can be connected in series. First, the electrical isolation line 214 can be seen between the first bottom electrode 210 and the second bottom electrode 212. The first active layer 220 is shown in electrical contact with the first bottom electrode 210 and the first top electrode 230. A gap 240 between the first active layer 220 and the second active layer 222 allows the first top electrode 230 to contact the second bottom electrode 212 between sub-cells to create a series connection between cells.

Sub-cell optimization of photovoltaic cells can be used to limit serial resistance with organic photovoltaic modules. In some embodiments comprising an organic photovoltaic module (OPV), an opaque OPV can be fabricated. In embodiments with an opaque OPV, one of the electrodes, for example the bottom electrode 210, can be opaque and fabricated from a highly conductive metallic electrode while the second, for example, top electrode 230, can be made from a transparent typically less-conductive electrode material. In embodiments comprising an opaque OPV an array of metallic bus bars can be printed onto the OPV module to reduce the series resistance.

Sub-cell module configurations can reduce resistive power losses, but results in area loss in the interconnect regions and also result in visible patterning which may be undesirable for transparent PV applications. In some embodiments the viewing appearance can also be compromised by the electrical isolation lines 214 within the active area. The addition of wider electrical isolation lines 214 increases design and fabrication tolerance, but wider lines have greater visibility and, being inactive, cause a loss in the overall current generating area and reduce module efficiency.

In some embodiments, fabricating a single cell module 300 versus a monolithic series integrated solar module 200 eliminates the patterning lines present in the central active area of the module. For many applications of transparent PVs, it is desirable for this central region to be transparent and free of visual patterns. An example of an undesirable patterning line in the central region is illustrated by electrical isolation line 214 in FIG. 2C.

Figure 3A:
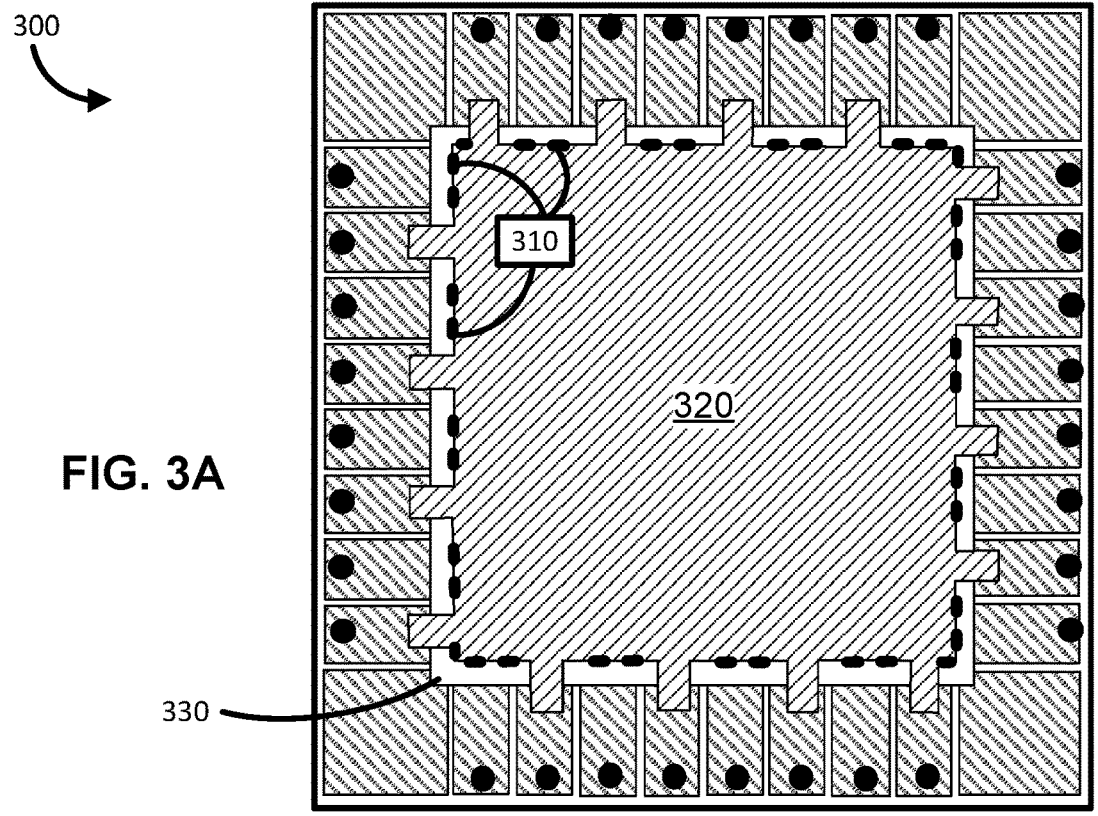
FIG. 3A is a plan view of a single cell photovoltaic module according to an embodiment of the present invention.
Figure 3B:
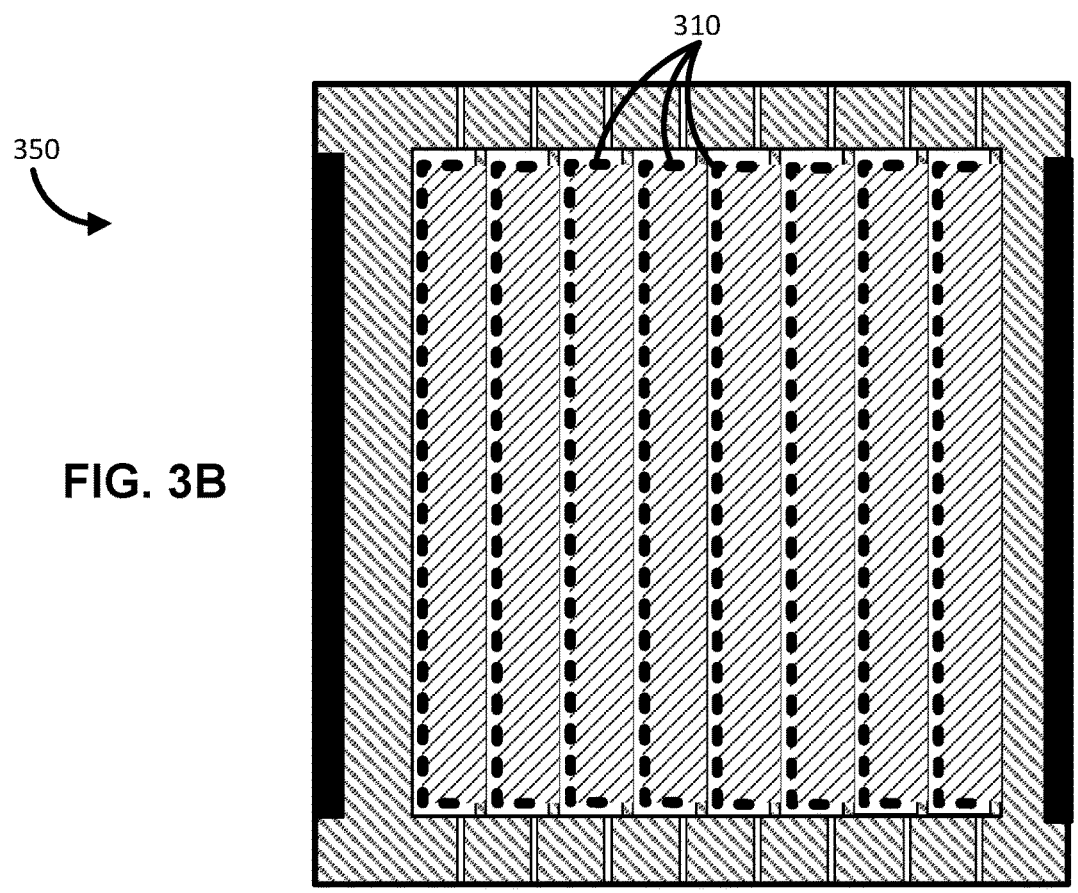
FIG. 3B is a plan view of a series integrated photovoltaic module.

Patterning lines can also include the edges of electrodes and active layers that are either inside or outside of the central module area, but require fabrication considerations as these may include potential electrical shorting locations that can cause decreased performance or prevent the module from functioning. The patterning lines can be fabricated using shadow masking, laser scribing, or other techniques in order to isolate bottom and top electrodes as well as remove material from the active layers to provide contact pathways. FIGS. 3A and 3B illustrate the reduced number and length of patterning lines used in a single cell module versus a series integrated module. FIG. 3A is a plan view of a single cell module 300. The patterning lines 310, which are associated with edges of features in the module, indicate regions of the single cell module 300 where potential shorting locations exist that can cause decreased performance or prevent the module from functioning. In some embodiments, the single cell module 300 will have a number of patterning lines associated with the perimeter of the top electrode 320 and the active layer 330.

FIG. 3B is a plan view of a series integrated module 350 with 8 sub-cells. There are patterning lines 310 associated with each individual sub-cell in the series integrated module 350. In the integrated module illustrated in FIG. 3B, patterning lines are associated with the perimeter of the active area of the module and are disposed within the active area of the module. In contrast with the single cell module 300, the series integrated module 350 has 2.5 times more patterning lines 310. The reduced number of patterning lines 310 in the single cell module 300 can provide several benefits including reducing the complexity of the contacting scheme; implementing non-standard and non-rectangular application geometries; reducing the mask edge contact per area; reducing dead areas that do not contribute to power generation; and improved aesthetics.

While sub-cells can be used to decrease the travel distance for charges generated in the active area of a module, several techniques can be applied to reduce the charge travel distance of single cell modules. For example, parameters that can be adjusted to reduce the charge travel distance include the aspect ratio of the module geometry, the resistivity of the electrode the contact, and busbar materials and the like.

FIGS. 4A-D show the direction of charge travel in a single cell module with an increasing number of contacts in four different contact configurations. The various configurations illustrate the contact edge impact on charge travel distance with reference to just one of the two electrodes utilized in a PV cell. FIGS. 4A-D illustrate only a single electrode for simplicity, but such configurations can be overlaid with a photovoltaic active material layer and a second counter electrode. In practice, contact and busbar patterns can be used and optimized for each electrode. For example, both electrodes could have full perimeter contact for optimized charge extraction or the amount of perimeter contact could be varied between the top and bottom electrodes to have more contact with the higher resistance electrode to better match resistance losses.

FIG. 4A shows a first contact configuration 401 that includes a first busbar or contact 410 for an electrode 450. FIG. 4B shows a second busbar or contact configuration 402 that includes the first contact 410 and a second contact 412. FIG. 4C shows a third busbar or contact configuration 403 that includes the first contact 410, the second contact 412, and a third contact 414. FIG. 4D shows a fourth busbar or contact configuration 404 that includes first contact 410, the second contact 412, the third contact 414, and a fourth contact 416. In each configuration, the charge travel distance can depend on the number and location of contacts in electrical contact with the electrode 450.

The embodiments shown in FIGS. 4A-D illustrate how current is being generated throughout the entire active area of the module and needs to travel to contact points on the edge, or periphery of the electrode 450. The locations of contacts and busbars placed around the perimeter of the electrode 450 can be adjusted to provide the shortest travel distance for charge to travel at various locations within the cell. For example, in the first configuration 401, referring to FIG. 4A, all charges in the active area of the electrode 450 travel in a first direction 420 to reach the first contact 410. In this configuration, charges near the opposite edge 452 of the electrode 450 travel the entire distance across electrode 450 to reach the first contact 410. This configuration results in a higher sheet resistance and increased power loss. In the second contact configuration 402, referring to FIG. 4B, the second contact 412 enables charges on the electrode 450 to travel in a second direction 422. As discussed above, the second contact 412 reduces the effective width and charges can travel shorter distances resulting in a decreased power loss. In a configuration with two contacts such as the second contact configuration 402, the longest distance any charge must travel is now half of what it was with a single contact such as the first configuration 401. The third contact configuration 403, referring to FIG. 4C, and the fourth contact configuration 404, referring to FIG. 4D, provide a third direction 424 and a fourth direction 426 to further reduce the travel distance for charges on the electrode 450. In some embodiments, having full perimeter contact can minimize power loss for any single cell without adding internal busing or other design elements. With full perimeter contact, all current pathway distances to an edge contact are minimized.

The electrode 450 can be an electrical conductor used to make contact with a nonmetallic part of a circuit, for example, organic photovoltaic material layer. The electrode 450 forms part of the active area of a module and can extend outside of the active area to connect with a busbar or various types of contacts (e.g. 410, 412, 414, 416). In some embodiments, sheet resistances of electrodes are generally in the $m\Omega/sq$ range for opaque electrodes and usually range from $1\ \Omega/sq$-$100\ \Omega/sq$ for transparent electrodes. In some embodiments, electrode 450 can have a higher resistance than busbars and/or contacts 410, 412, 414, 416. Electrode 450 can be fabricated using physical vapor deposition (PVD) techniques such as thermal evaporation, electron beam physical vapor deposition (EBPV), sputter deposition, or the like.

The square single cell module configurations shown in FIGS. 4A-4D are exemplary and modules can be varied height, width, and shape. In some embodiments, the contact configuration can be determined based on the requirements of a particular application. Any of the single cell modules illustrated in FIGS. 4A-4D can be used in, for example, fitness trackers, pulse tracker bands, watches, fitness armbands with a charging capability, glasses requiring a localized power source, wearable heads-up displays, wearable LED jewelry, medical monitoring patches, built-in cellphone emergency chargers, electronic labels, and the like. In some embodiments, the size range of the single cell module can be 2-5 cm across. Single cell modules can be made for even larger sizes but charge travel distance will increase. Generally, a transparent single cell module can be integrated into an information display system to generate charge for the associated system. The limitation on size will depend on the power requirements for the intended application and the module stack architecture used.

FIG. 5 shows a table with dimensionless ratios of charge travel distances for different perimeter contact configurations. Table 500 includes calculations from a 1000-point mesh in an x-direction and a y-direction. A distance to the nearest electrode is calculated for each point and the distances are summed for all points in the mesh. The number shown in the table for each configuration is the ratio of the summed distances of the points for a given configuration to the summed distances of the points for the configuration with a single contact along one full edge. Table 500 shows the reduction in point distances for each busbar configuration as a dimensionless ratio for comparing different electrode configurations to a baseline, one full edge contact configuration.

Figure 6:
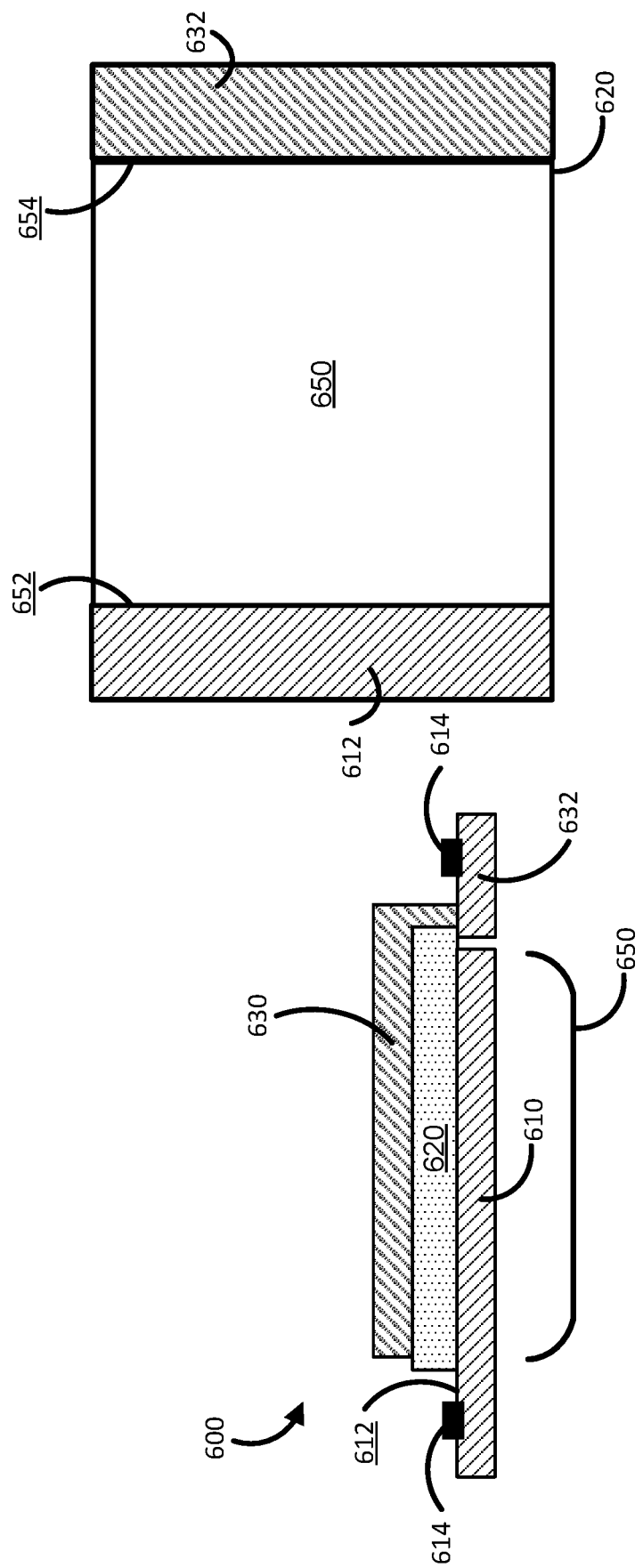
FIG. 6A is a cross-sectional view of an example single cell module having two contacts according to an embodiment of the present invention.
FIG. 6B is a plan view of an example single cell module having two contacts according to an embodiment of the present invention.

FIG. 6A is a cross-sectional view of an example single cell module having two contacts according to an embodiment of the present invention. The single cell module 600 includes a first electrode layer 610, a contact point 614 on a first electrode pad 612, one or more photovoltaic material layers 620, a second electrode layer 630, and a contact point 634 on a second electrode pad 632. Since PV cells can be fabricated using a layering process, starting with a bottom layer and adding elements until a top layer is reached, references to first and second elements of a cell can also be referred to as bottom and top elements. For purposes of clarity, references herein utilize the bottom/top nomenclature in reference to various figures, but it will be appreciated that alternative fabrication processes and cell designs can be utilized in which right/left nomenclature could be appropriate. Accordingly, the bottom/top nomenclature utilized here is not intended to limit the scope of the present invention and is utilized for first/second nomenclature merely for purposes of clarity.

In some embodiments, a central transparent area 650, which can also be referred to as an active area, can include the overlapping portions of the top electrode 630, the one or more photovoltaic material layers 820, and the bottom electrode 610. The single cell module 600 shows a method contacting a cathode and an anode using a single point of contact. In the embodiment shown in FIGS. 6A and 6B, the contacts are non-interdigitated and non-overlapping (each described further below).

FIG. 6B is a plan view of an example single cell module having two contacts according to an embodiment of the present invention. In some embodiments, electrical contact between the bottom electrode 610 and the central transparent area can extend along a first side 652 of the central transparent area 650 and electrical contact between the top electrode 630 and the central transparent area can extend along a second side 654 of the central transparent area 650. In some embodiments, the contact point 614 formed on the first electrode pad 612 and contact point 634 formed on the second electrode pad 632 can be fabricated using low resistance materials, which can also be used on busbars or other contacts as described herein.

FIG. 7 shows dimensionless ratios of charge travel distances for different two-contact configurations of a single cell module. The configurations contain different designs for two contact layouts where there is one contact or busbar for each electrode on a square single cell module. The corner contacts configuration 704 and the C-shape contact configuration 706 are compared to the first configuration 702 where there is a single contact for each electrode on opposing sides. The table 700 shows the travel distance is reduced when comparing the corner contacts configuration 704 to the first configuration 702. The table 700 shows the travel distance can be reduced further when comparing the C-shape contact configuration 706 to the first configuration 702. In some embodiments, the C-shape contact configuration can be comprised of a c-shaped conductive material region.

Figure 8A:
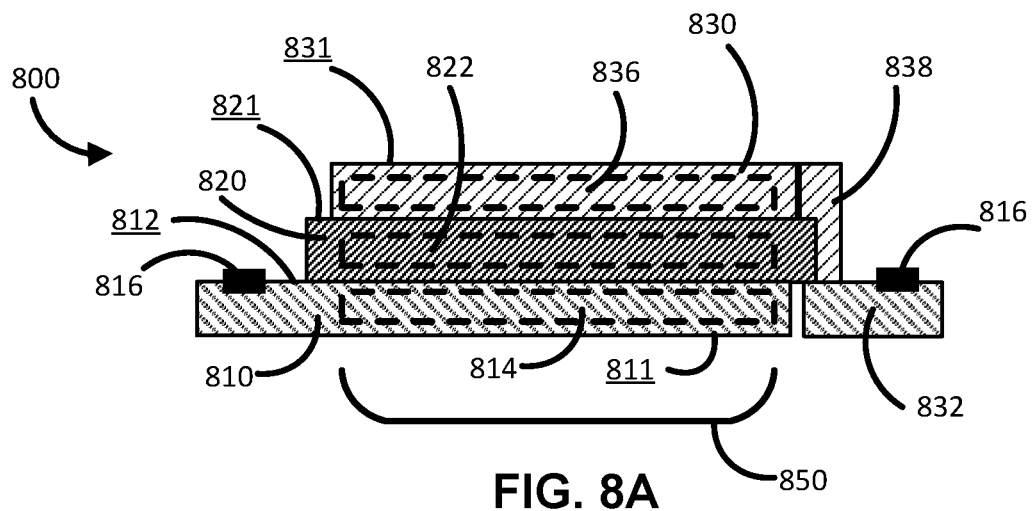
FIG. 8A is a cross-sectional view of an example single cell module with interdigitated contact pads according to an embodiment of the present invention.

FIG. 8A is a cross-sectional view of an example single cell module with interdigitated contact pads according to an embodiment of the present invention. The single cell module 800 can include a bottom electrode 810 including a bottom surface 811 and an opposing top surface. A contiguous central region 814 of the bottom electrode 810 is electrically coupled to a set of electrode pads surrounding the contiguous central region. In FIG. 8A, bottom electrode pad 812 is illustrated as an example of the set of the bottom electrode pads.

In some embodiments, the bottom electrode 810 can also include one or more isolated electrode pads 832 that are electrically isolated from the contiguous central region 814 and the set of electrode pads represented by bottom electrode pad 812. As illustrated in FIG. 8A, one or more low resistance contact points 816 and 836 can be formed on the bottom electrode pads 812 and the isolated electrode pads 832.

In some embodiments, the single cell module 800 can include one or more photovoltaic material layers 820 including a top surface 821 and an opposing bottom surface. A contiguous central region 822 of the photovoltaic material layer is illustrated. In some embodiments, the single cell module 800 can also include a top electrode 830 having a top surface 831 and an opposing bottom surface. A contiguous central region 836 of the top electrode 830 is electrically coupled to a set of electrode pads surrounding the contiguous central region. In FIG. 8A, top electrode pad 838 is illustrated as an example of the set of the top electrode pads. As described herein, the electrode pads extending from, or disposed outside the periphery of the contiguous central region, provide for electrical contact to the contiguous central region and the contact points electrically coupled to the electrode pads. Referring to FIG. 8A, the top electrode 830 can be electrically coupled to isolated electrode pad 832.

Referring once again to FIG. 8A, a central transparent area 850 of the single cell module 800 can be defined by the overlap of the contiguous central regions 814, 822, and 836 of the bottom electrode, photovoltaic material layers, and the top electrode, respectively. In some embodiments, the central transparent area 850 of the single cell module 800 can be transparent to visible light while absorbing light in the ultraviolet and/or infrared portions of the spectrum.

Figure 8B:
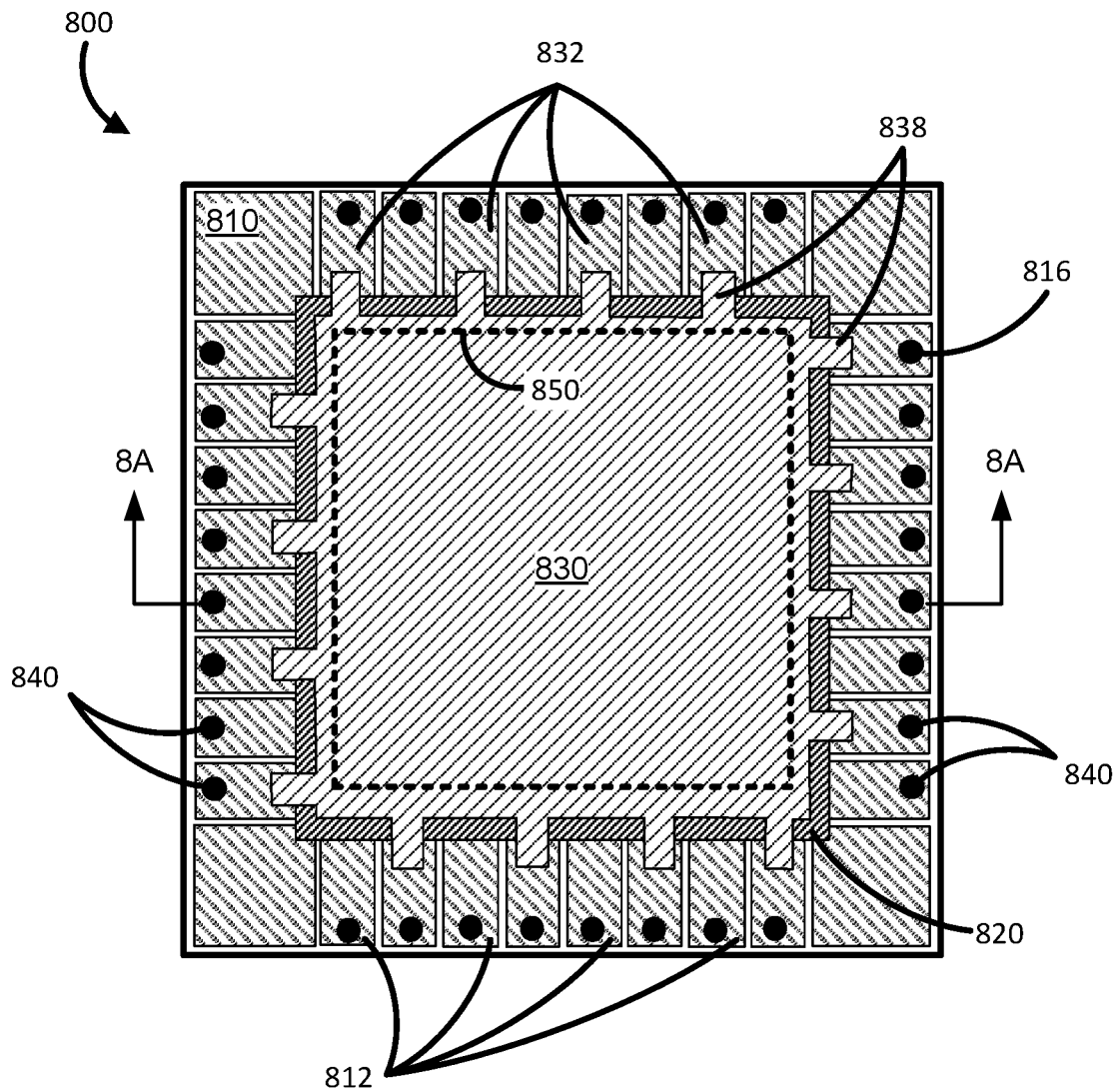
FIG. 8B is a plan view of an example single cell module with interdigitated contact pads according to an embodiment of the present invention.

FIG. 8B is a plan view of an example single cell module with interdigitated contact pads according to an embodiment of the present invention. In some embodiments, electrical contact to the bottom electrode 810 and the top electrode 830 can be implemented using multiple interdigitated pairs of electrode pads 812/832 having interdigitated pairs of contact points 840 on all edges for both cathode and anode, where the cathode and the anode correspond to the bottom electrode 810 and the top electrode 830. A single pair of interdigitated contact points 840 can be contact points formed on an isolated electrode pad 832 coupled to the top electrode 830 and a bottom electrode pad 812 coupled to the bottom electrode. In some embodiments, interdigitatedly can describe a pattern of alternating isolated electrode pads 832 coupled to the top electrode 830 and bottom electrode pad 812.

FIG. 8B shows an example with four pairs of electrode pads for the cathode and anode on all four sides of a square single cell module 800. For example, isolated electrode pads 832 are electrically coupled to the top electrode pads 838 extending from the periphery of the contiguous central region of the top electrode 830 and bottom electrode pads 812 are electrically coupled to the contiguous central region of the bottom electrode 810. Both isolated electrode pads 832 and bottom electrode pads 812 can have a low resistance contact point 816 formed thereon. The contact points can extend from electrode layer, be flush with the electrode layer, or recessed. Accordingly, in FIG. 8B, 16 total contact points 816 are provided for each electrode, with eight total contact points (including contact points for both electrodes) on each edge of the single cell module 800, resulting in four pairs of interdigitated contact points 840 per side. The number of electrode pads and contact points can be increased or decreased as needed.

FIGS. 8C-8N show a breakout of each layer of the interdigitated single cell module shown in FIG. 8B. FIG. 8C shows a first layer of a single cell module. In some embodiments, the first layer comprises a bottom electrode 810. The bottom electrode 810 can include a contiguous central region 814 that has a periphery 813 that extends out to four bottom electrode pads 812 on each edge of the module. The bottom electrode pads 812 can provide a location for contact points 860 on the bottom electrode 810. In some embodiments, the bottom electrode 810 can include one or more isolated electrode pads 832 that are electrically isolated from the contiguous central region 814 and the bottom electrode pads 812. In some embodiments, the isolated electrode pads 832 can be interdigitated with the bottom electrode pads 812 (e.g., four on each side of the module). The one or more isolated electrode pads 832 can support contact points 860 electrically coupled to the top electrode 830 and, along with bottom electrode pads 812, form electrode pad pairs in an interdigitated manner. The four isolated corner pads that do not connect to the cell can be fabricated to provide even color and optical effects across the substrate. A corner mark 818 illustrated on one of the four isolated corner pads can help to orient the substrates during processing and acts as a visual guide to the top and bottom side of the substrate. FIG. 8D shows a first partially manufactured single cell module 801 comprising the first layer.

FIG. 8E shows a second layer of a single cell module. The second layer can include one or more photovoltaic material layers 820 and can be positioned above the bottom electrode central region 814. The photovoltaic material layers 820 can include a central transparent area 822 corresponding to the active area for the module. Portions of the photovoltaic material layers 820 can extend beyond the periphery 813 of the contiguous central region 814 to cover a portion of both the bottom electrode pads 812 and the isolated electrode pads 832. The photovoltaic material layers 820 can act as electrical insulation to impede electrical contact between a top electrode 830 and bottom electrode 810. FIG. 8F shows a second partially manufactured single cell module 802 comprising the first and second layers formed with the bottom electrode central region 814 and the active area central region 822 substantially aligned.

FIG. 8G shows a third layer of a single cell module. The third layer can include the top electrode 830. The top electrode 830 can be formed on top of the one or more photovoltaic material layers 820 with a top central region 836 that can correspond to the active area of the single cell module. The top electrode 830 can include one or more top electrode pads 838 that extend out from the top central region 836 to connect to the optional one or more isolated electrode pads 832 that are disposed adjacent the edge of the substrate. FIG. 8H shows a third partially manufactured single cell module 803 comprising the first, second, and third layers formed with the bottom electrode central region 814, the active area central region 822, and the top central region 836 substantially aligned.

FIG. 8I shows a fourth layer of a single cell module. The fourth layer can include cavity glass 840 or other glass or barrier materials that can be placed and/or fabricated over the module layers. The cavity glass 840 can be formed to leave one or more of the electrical elements, such as the one or more isolated electrode pads 832 and the bottom electrode pads 812, exposed. FIG. 8J shows a fourth partially manufactured single cell module 804 comprising the first, second, third, and fourth layers formed with the bottom electrode central region 814, the active area central region 822, the top central region 836 and the cavity glass 840 substantially aligned.

FIG. 8K shows a fifth layer of a single cell module. The fifth layer can include a size aperture 850. The size aperture 850 can be used to block light outside the desired active area size. FIG. 8L shows a fifth partially manufactured single cell module 805 comprising the first, second, third, fourth, and fifth layers formed with the bottom electrode central region 814, the active area central region 822, the top central region 834, the cavity glass 840, and the size aperture 850 substantially aligned.

FIG. 8M shows a sixth layer of a single cell module. The sixth layer can include one or more low resistance contact points 816. The one or more contact points 816 can be formed on each individual bottom electrode pad 812 and isolated electrode pad 832. Connections to the single cell module from other devices can be made using the one or more contact points 816 on each edge of the module. FIG. 8N shows a fully manufactured single cell module 806 comprising the first, second, third, fourth, fifth, and sixth layers formed with the bottom electrode central region 814, the active area central region 822, the top central region 834, the cavity glass 840, the size aperture 850, and the one or more contact points substantially aligned.

Figure 8P:
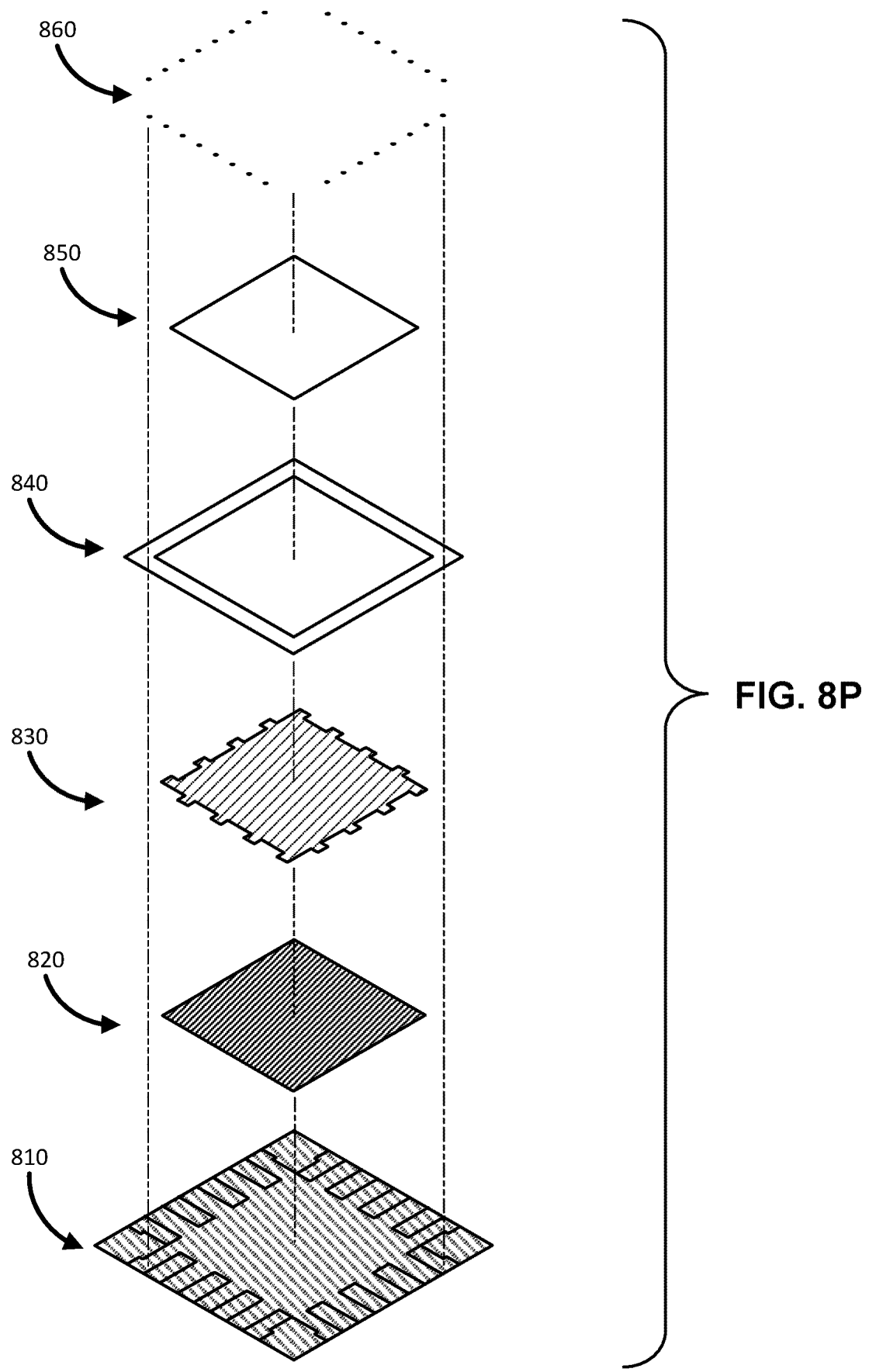
FIG. 8P shows an exploded view of the single cell module according to an embodiment of the present invention.

FIG. 8P shows an exploded view of the single cell module according to an embodiment of the present invention. The single cell module includes a bottom electrode 810, one or more photovoltaic material layers 820, a top electrode 830, cavity glass 840 or other barrier material, a size aperture 850, and a particular arrangement of one or more contact points 860. It should be appreciated that the specific layers illustrated in FIG. 8P provide a particular arrangement of a single cell module with interdigitated contacts according to an embodiment of the present invention. Other layers or contacts may also be formed thereon according to alternative embodiments. Moreover, the individual module layers and components illustrated in FIG. 8P may include multiple sub-layers that may be formed and/or fabricated in various arrangements as appropriate to the individual module. Furthermore, additional layers or components may be added or existing layers or components may be removed depending on the particular applications. One of ordinary skill in the art would recognize many variations, modifications, and alternatives.

Power losses from resistance (e.g., in the electrodes, busbars, and contact points) can be related to the level of the current passing through the resistive features, the dimensions of the resistive features, and the resistivity of the features. In some embodiments, the materials and architecture and/or the geometry can be designed to minimize the current and reduce power losses. In some embodiments, components of the PV module can be designed to operate at an increased voltage and lower current to minimize losses.

FIG. 9 shows dimensionless ratios of charge travel distances for different interdigitated contact configurations. The first column 901 shows the different numbers of contacts in various embodiments for each electrode on each of the 4 sides of a square single cell module. The second column 902 shows the dimensionless ratio of charge travel distances for each embodiment in the first column 901. The third column 903 shows a plan view for each embodiment in the first column 901. The figures in the third column illustrate electrode details for each embodiment. Using row 930 column 903 as a reference, the black regions on the plan view illustrate the top electrode geometry. The white gaps 932 illustrate the contact points for the bottom electrode and the protruding black regions 934 illustrate the contact points for the top electrode. The last row of table 900 shows a comparison for a fully contacted perimeter for both top and bottom electrodes (the minimum sum of point distances that can be achieved with a top and bottom electrode configuration).

The number of interdigitated contact pairs can be adjusted to optimize the sheet resistance of both the top and bottom electrodes. In some embodiments, increasing the number of interdigitated contact pairs can reduce the sheet resistance of the electrodes and decrease the power losses when scaling the single cell modules to larger areas. Increasing the number of contact pairs reduces the average charge travel distance and causes the percent power loss to decrease. In some embodiments, increasing the number of interdigitated contact pairs can maximize low resistance edge coverage for the electrodes (either contact point or busbar). Maximizing the edge coverage in some embodiments can include maximizing the points of contact or forming a connection to a busbar around the full perimeter. In some embodiments, a full perimeter contact to a low resistance busbar for both electrodes can minimize the power loss. An alternative to full perimeter contact is to form interdigitated contacts for both electrodes around the perimeter of the single cell module active area.

Referring to FIGS. 8A and 8B, connection must be made with both the bottom electrode 810 and the top electrode 830 (the anode and cathode) to be considered a contact for the purposes determining the dimensionless ratio of charge travel distances. A connection includes a first contact point with the anode and a second contact point with the cathode. The second column 902 shows ratios of point distances, or the distance individual charges must travel from any point on the active area. Table 900 includes contact points for both top and bottom interdigitated electrodes. All the configurations in table 900 are for a 4-edge perimeter contact with varying numbers of interdigitated contacts on each side. The first row 910 with 0.25-contacts per side and the second row 920 with 0.5-contacts per side are equivalent contact numbers. The configuration for the first row 910 with 0.25-contacts per side can include a left side that is a bottom electrode contact point and a right side that is a top electrode contact point. The two contact pattern shown in the first row 910 includes only one contact point per electrode. The first row 910 is therefore used as the basis of comparison to determine the dimensionless ratio to characterize charge travel distances for all other configurations.

In some embodiments, the single cell module can include 0.5-contacts per side as shown and described in the second row 920. Embodiments with 0.5-contacts per side can include left and right side bottom electrode contact points and top and bottom side top electrode contact points. Embodiments described herein can form a plurality of contacts or continuous contact on each side of a single cell module and can further reduce charge travel distance for various configurations. For example, using a 1000-point mesh in both x and y, the sum of point distances to the nearest electrode in each configuration in column 901 of table 900 is divided by the sum of point distances for a design with 0.25 contacts for each electrode per side.

Figure 10:
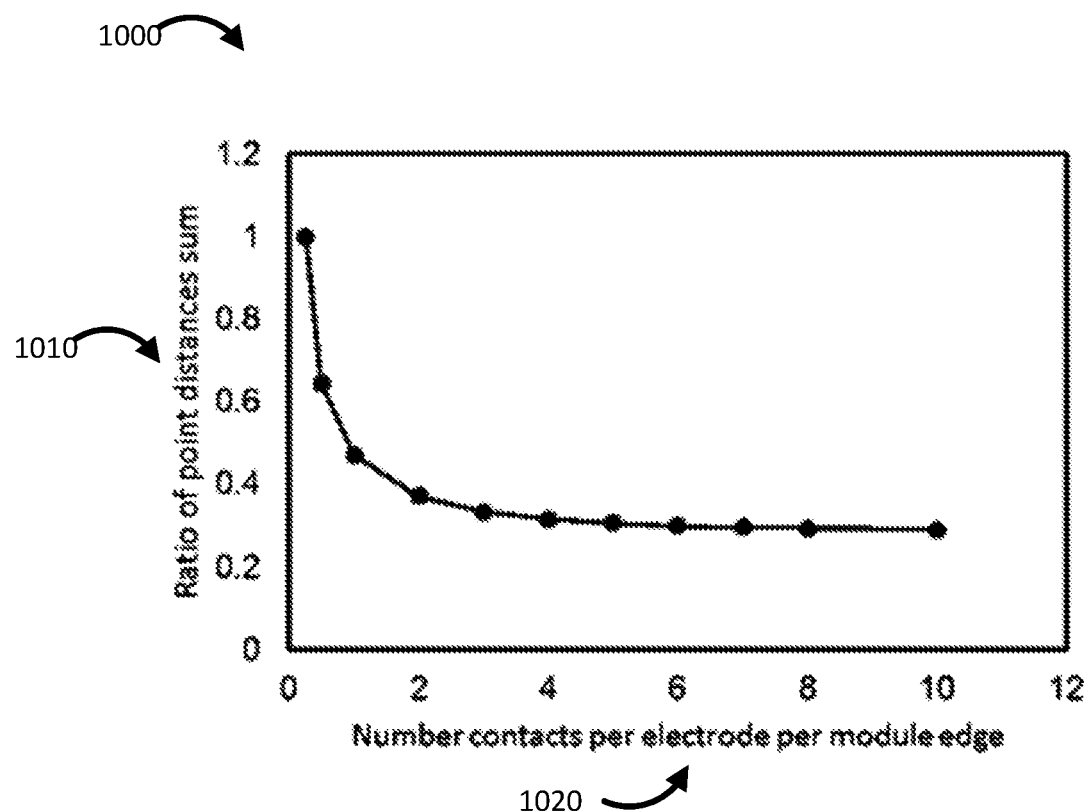
FIG. 10 shows dimensionless ratios of charge travel distance as a function of the number of contacts per edge for an active area.

FIG. 10 shows dimensionless ratios of charge travel distance as a function of the number of contacts per edge for an active area. The plot 1000 shows the dimensionless ratio of charge travel distance along the y-axis 1010 and corresponds to the second column 902 in FIG. 9. The plot 1000 shows the number of contacts per electrode per module edge along the x-axis 1020 and corresponds to the third column 903 in FIG. 9. The reduced charge travel distance quickly flattens out as the number of contacts per electrode per module edge increases beyond 5 contacts per side.

Figure 11A:
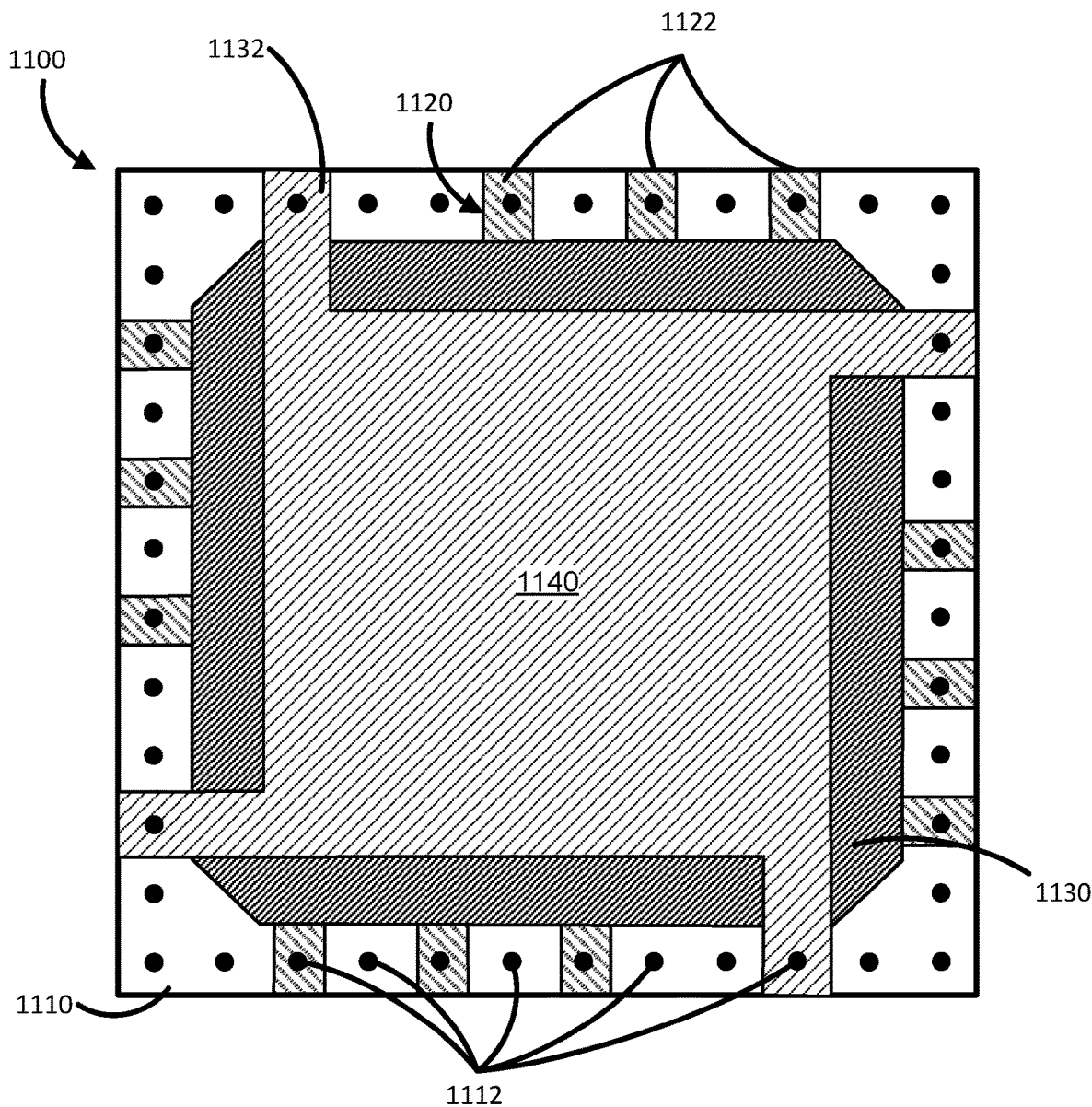
FIG. 11A shows a plan view of a photovoltaic cell with an interdigitated contact arrangement according to an embodiment of the present invention.

FIG. 11A shows a plan view of a photovoltaic (PV) module with an interdigitated contact arrangement according to an embodiment of the present invention. PV module 1100 includes a substrate 1110, a bottom electrode 1120 (illustrated by electrode pads 1122), a photovoltaic material layer 1130 and a top electrode 1140. PVC 1100 shows an embodiment with a particular arrangement of electrode pad/contact point connections 1112 for the efficient charge (power) extraction from the substrate 1110. In some embodiments, the placement of top electrode pads 1132 with respect to the bottom electrode pads 1122 can vary. For example, PV module 1100 includes just one top electrode pad 1132 per side versus single cell module 800 in FIG. 8 which incorporated four top electrode pads per side.

Figure 11B:
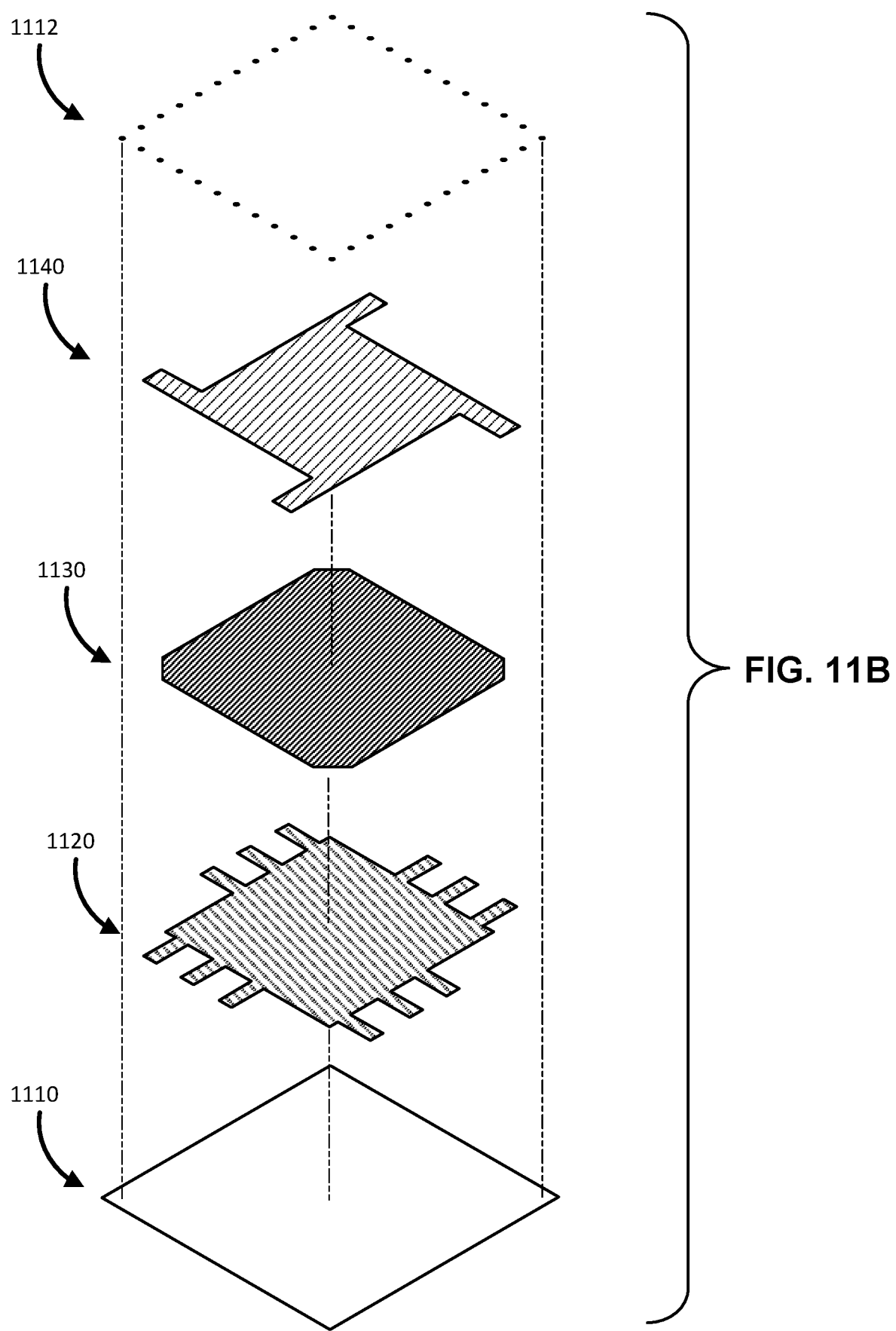
FIG. 11B shows an exploded view of a photovoltaic cell with an interdigitated contact arrangement according to an embodiment of the present invention.

FIG. 11B shows an exploded view of PVC 1100 with an interdigitated contact arrangement. FIG. 11B includes a substrate 1110, a bottom electrode 1120, a photovoltaic material layer 1130, a top electrode 1140, and a particular arrangement of electrode pad/contact point connections 1112. It should be appreciated that the specific layers illustrated in FIG. 11B provide a particular arrangement of a PV with interdigitated contacts according to an embodiment of the present invention. Other layers or contacts may also be formed thereon according to alternative embodiments. Moreover, the individual module layers and components illustrated in FIG. 11B may include multiple sub-layers that may be formed and/or fabricated in various arrangements as appropriate to the individual module. Furthermore, additional layers or components may be added or existing layers or components may be removed depending on the particular applications. One of ordinary skill in the art would recognize many variations, modifications, and alternatives.

Figure 12A:
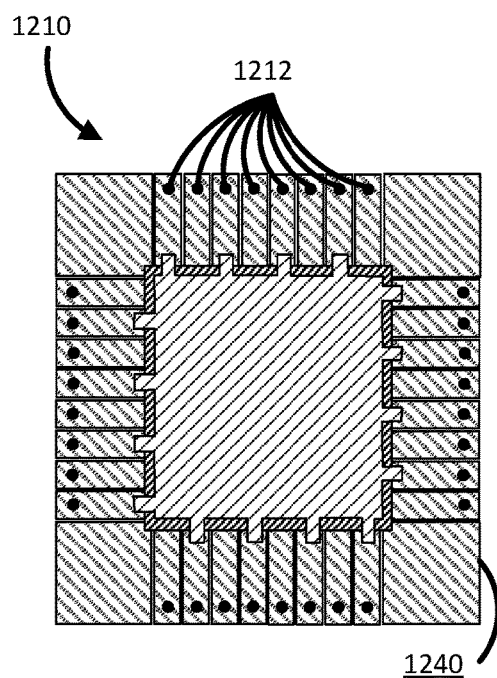
FIGS. 12A-12B show photovoltaic cells according to various geometric arrangements according to an embodiment of the present invention.
Figure 12B:
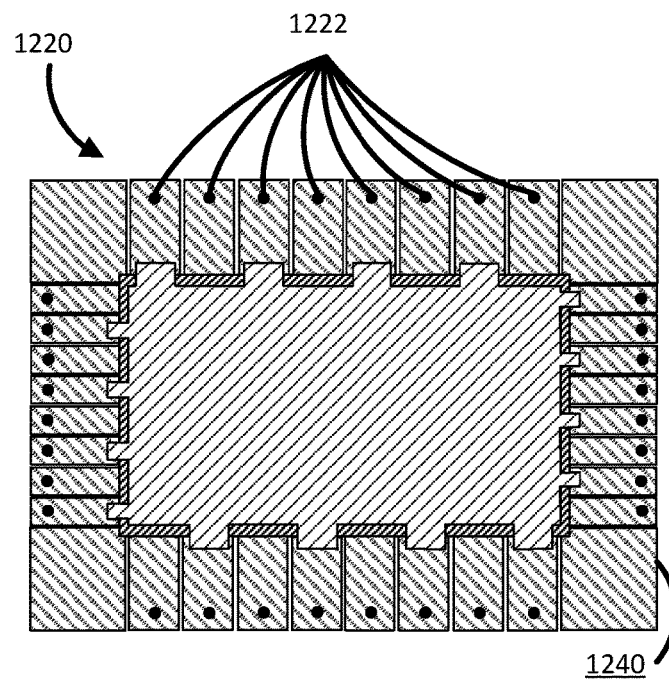

FIGS. 12A-12B show photovoltaic cells according to various geometric arrangements according to an embodiment of the present invention. Embodiments that implement a continuous busbar and/or interdigitated contacts can facilitate design and fabrication of various sizes and aspect ratios. For example, FIG. 12A shows a square PVC 1210 with 8 contact points 1212 per side. FIG. 12B shows a rectangular PVC 1212 with 8 contact points 1222 per side. Scaling PVC 1210 in a first direction to fabricate PVC 1212 can be achieved with minimal scaling and interface changes as the number of contact points can remain the same and, along side 1240, the module dimensions and contacts do not change. In some embodiments, the number of contacts on each side can be easily changed depending on design requirements. These design requirements could include increasing the number of contacts to reduce resistance (shorter path-lengths); decreasing the number of contacts for simplicity of making electrical contact to applications; decreasing the number of contacts to change contact widths if there are connection constraints; and removing the contacts from one edge. The number of contacts on each side do not need to be equal.

Figure 13:
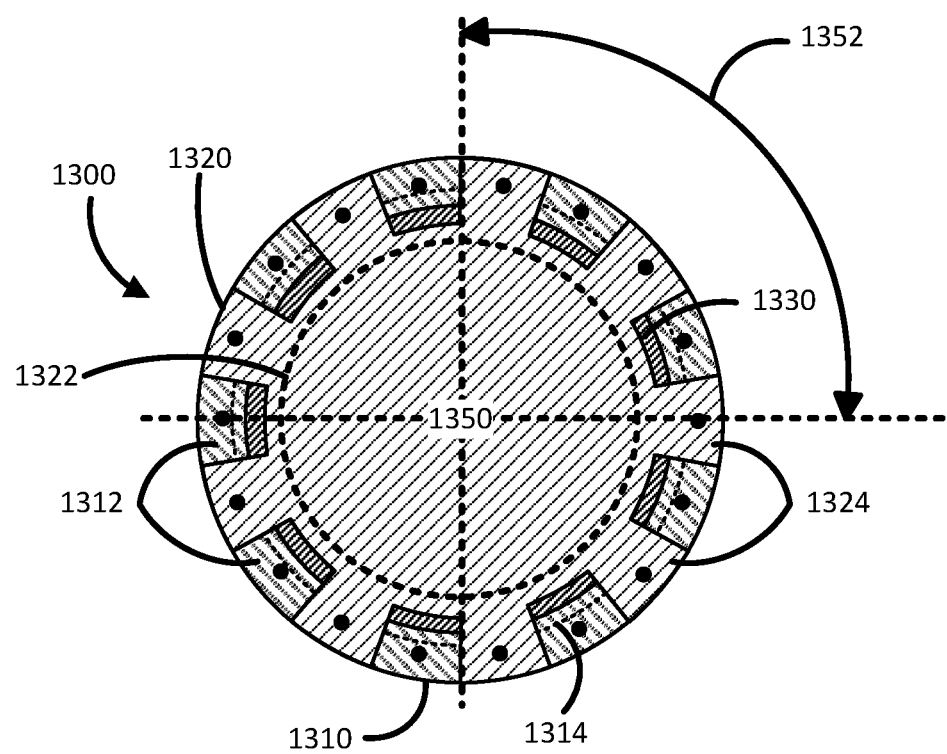
FIG. 13 shows a photovoltaic cell according to a circular arrangement according to an embodiment of the present invention.

In addition to the contact flexibility illustrated in FIGS. 12A and 12B, FIG. 13 shows the geometric flexibility of some embodiments. FIG. 13 shows a photovoltaic cell according to a circular arrangement according to an embodiment of the present invention. The photovoltaic cell includes a first transparent electrode layer 1310 that includes a contiguous first central region 1314. The first transparent electrode layer also includes a first set of electrode pads 1312 electrically coupled to the contiguous first central region 1314. The photovoltaic cell also includes a second transparent electrode layer 1320 that includes a contiguous second central region 1322 and a second set of electrode pads 1324 that are electrically coupled to the contiguous second central region 1322. The photovoltaic cell further includes a photovoltaic material layer 1330 located between the first transparent electrode layer 1310 and the second transparent electrode layer 1320.

The contiguous first central region 1314, the contiguous second central region 1322, and the photovoltaic material layer 1330 are aligned to form a central transparent area 1350 of the photovoltaic module. The central transparent area 1350 has a perimeter that includes a plurality of segments 1352. At least one of the first set of electrode pads 1312 and at least one of the second set of electrode pads 1324 are positioned on each segment 1352 of the plurality of segments of the perimeter of the central transparent area 1350.

Non-rectangular geometries can be implemented using a single cell module design because the added complexity of sub-cell sizes and connections are no longer a consideration. The single cell module design can be applied to other standard shapes or even asymmetric abstract geometries. One of ordinary skill in the art would recognize many variations, modifications, and alternatives.

Figure 14:
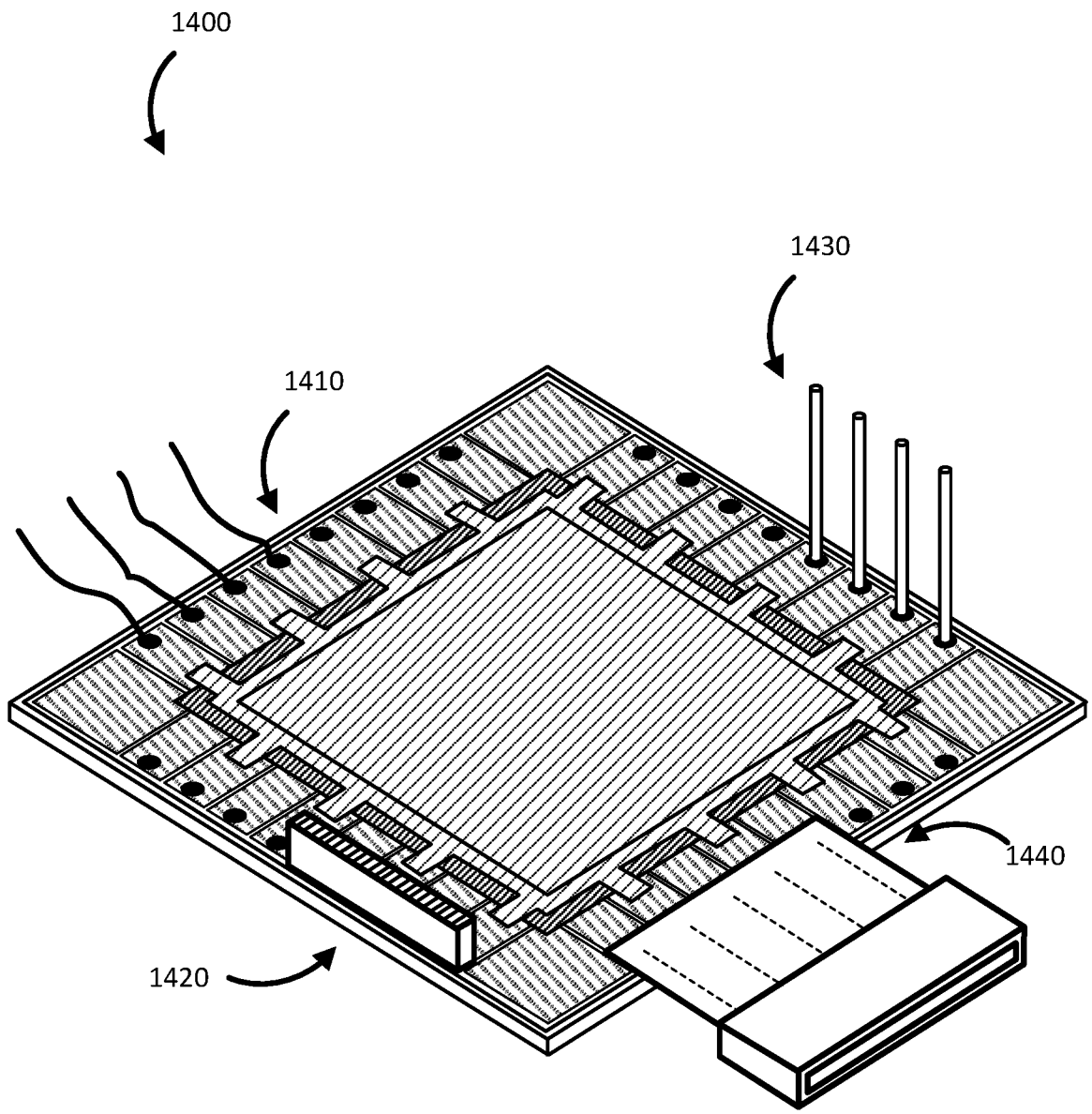
FIG. 14 shows a perspective view of various methods of contacting a single cell module according to an embodiment of the present invention.

FIG. 14 shows a perspective view of various methods of contacting a single cell module 1400. In some embodiments, the particular application will influence the selection of a contact method. For example, contact to the single cell module 1400 can be made using solder connections 1410 for applications that do not require frequent connect/disconnect cycles. In some embodiments, contact to the single cell module 1400 can also be implemented using anisotropic electronic connectors 1420 (e.g., ZEBRA® connectors), which consist of alternating conductive and insulating regions in a rubber or elastomer matrix. anisotropic electronic connectors 1420, when compressed in a rigid fixture, can make electrical contact to the interdigitated contacts of the single cell module 1400. In some embodiments, pin connections 1430 to contact points can be used. In some embodiments, alternating pin connections 1430 can be connected/bundled together (on a PCB or some other combined circuit) to provide a single anode and a single cathode connection for applying a load to the single cell module 1400. In some embodiments, contact to the single cell module can be made using flex-on-glass (FOG) anisotropic conductive adhesive 1440. An anisotropic conductive material can be used as the anisotropic conductive adhesive 1440. In addition to the embodiments shown, other permanent or temporary contact methods can also be employed such as alligator clips, custom clamp fixture, and the like. Contact components can be very low resistance and power losses through these components can be negligible.

Figure 15A:
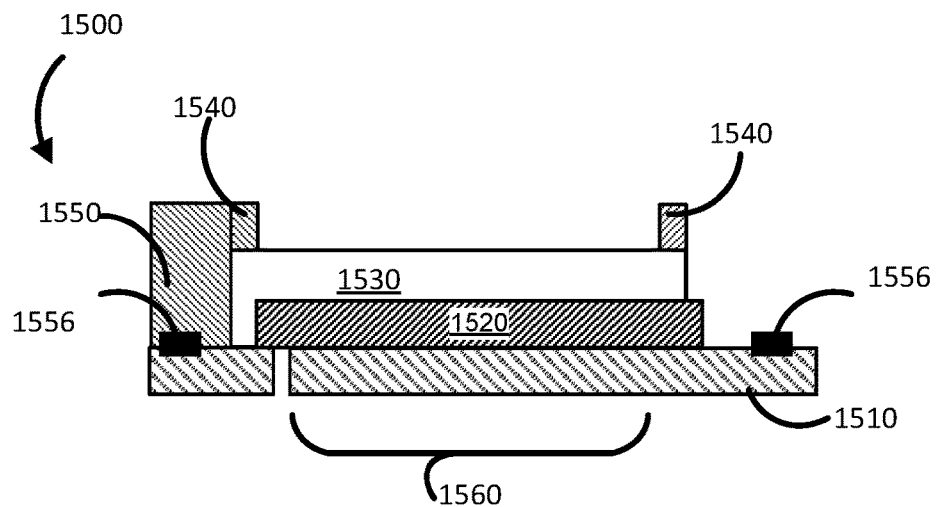
FIG. 15A is a cross-sectional view of a single cell module with a perimeter busbar for one or more electrodes according to an embodiment of the present invention.
Figure 15B:
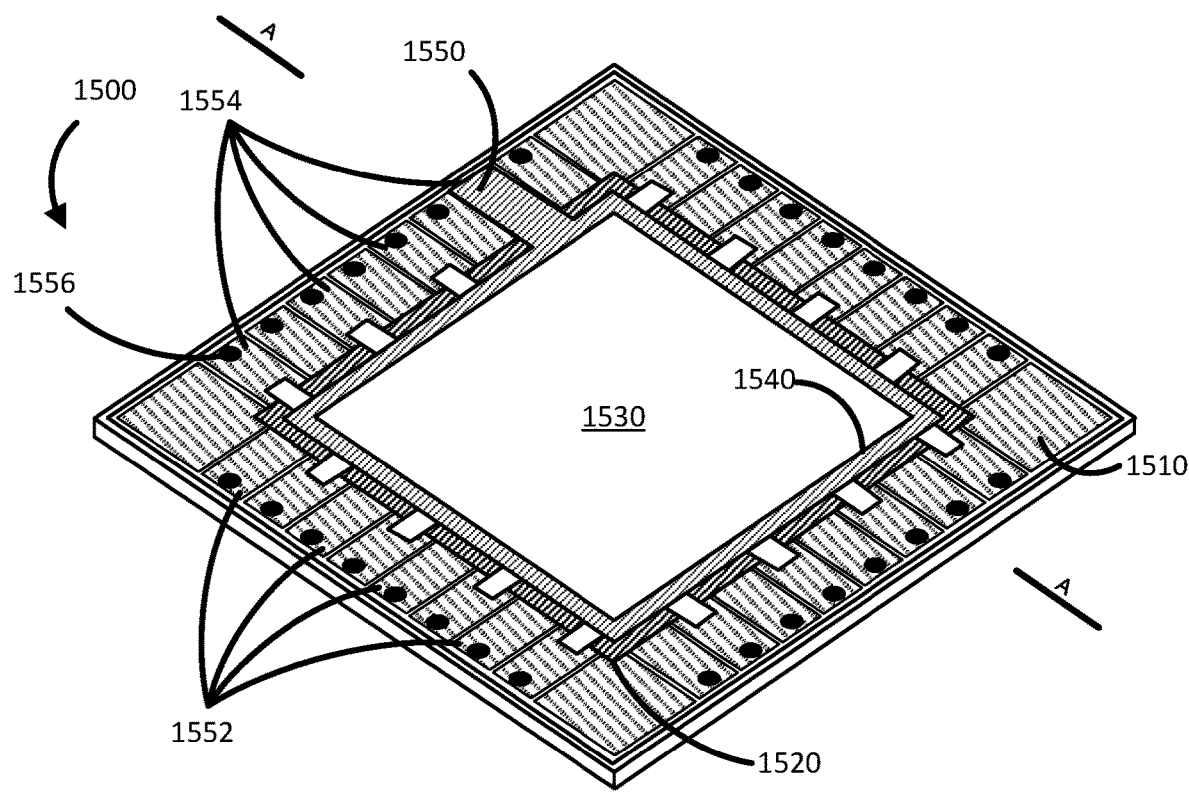
FIG. 15B is a perspective view of a single cell module with perimeter busbar for one or more electrodes according to an embodiment of the present invention.

FIG. 15A is a cross-sectional view of a single cell module with a perimeter busbar for one or more electrodes according to an embodiment of the present invention. FIG. 15B is a perspective view of a single cell module with perimeter busbar for one or more electrodes according to an embodiment of the present invention. FIG. 15A shows a cross-sectional view of FIG. 15B at line A.

The single cell module 1500 can include a bottom electrode layer 1510 including a top surface, a bottom surface, and a plurality of sides. In some embodiments, the bottom electrode layer 1510 can be comprised of a material that is transparent to visible light. In some embodiments, a first set of contact pads 1554 can be fabricated in the same layer as the bottom electrode layer 1510. Both the bottom electrode layer 1510 and the first set of contact pads 1554 can include one or more low resistance contact points 1556. The single cell module 1500 can also include one or more photovoltaic material layers 1520 including a top surface, a bottom surface, and a plurality of sides. In some embodiments, the one or more photovoltaic material layers 1520 can be transparent to visible light. In some embodiments, the single cell module can include a top electrode layer 1530 including a top surface, a bottom surface, and a plurality of sides. The top electrode layer 1530 can be transparent to visible light.

In some embodiments, the single cell module can include a perimeter busbar 1540 and a busbar extension 1550. The perimeter busbar 1540 can be in contact with at least a portion of each side of the plurality of sides of the top electrode to provide a low resistance pathway for charge extracted in the top electrode 1530 to reach the busbar extension 1550 on the edge of the single cell module 1500. Different busbar patterns can be designed as needed to bus charge to different locations for contact. In some embodiments, as discussed in relation to FIG. 16, a similar perimeter busbar can also be used to aid in moving charge from the bottom electrode. In some embodiments, perimeter busbar 1540 is opaque and can define, for instance, in conjunction with an aperture, an active area 1560 as illustrated in FIG. 15A where light can impinge on the single cell module 1500. The active area 1560 can include a contiguous central region of the top electrode 1530, a contiguous central region of the photovoltaic material layer 1520, and a contiguous central region of the bottom electrode 1510.

In the some embodiments, the perimeter busbar 1540 illustrated in FIGS. 15A and 15B provides a pathway to transport current between electrodes and contact points 1556. The bottom electrode layer 1510 can include one or more electrode pads 1552. Each electrode pad can have one or more contact points 1556 to form an interface for the single cell module 1500. In some embodiments, two or more sets of electrode pads can be interdigitated. For example, a first set of electrode pads 1554 can be electrically isolated from the bottom electrode layer 1510. The perimeter busbar 1540 can be in electrical contact with the first set of electrode pads 1554. A second set of electrode pads 1552 can be in electrical contact with the bottom electrode 1510.

Figure 16A:
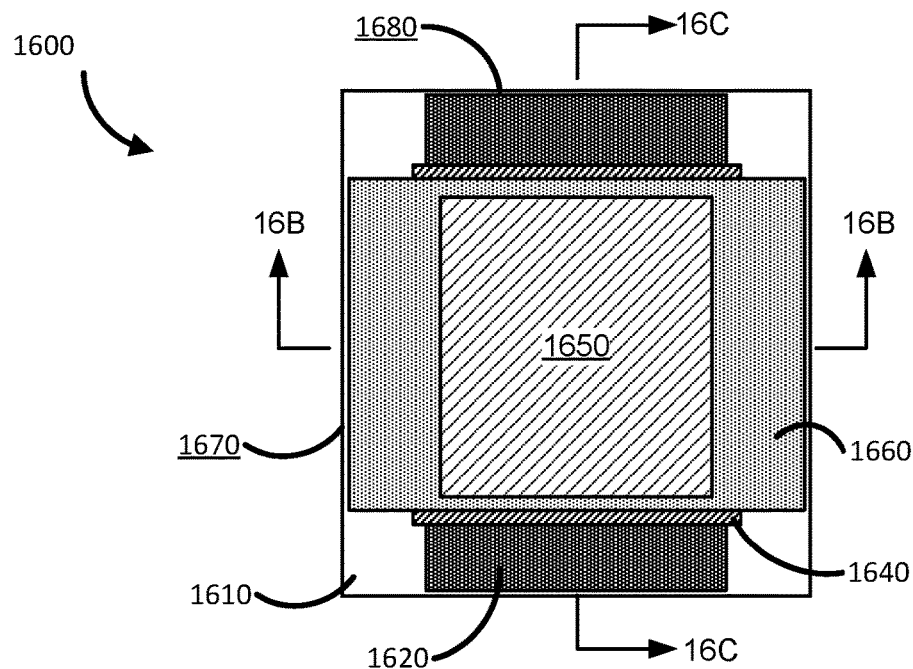
FIG. 16A is a plan view of a single cell module with busbars in contact with the perimeter of an electrode according to an embodiment of the present invention.

FIG. 16A is a plan view of a single cell module with busbars in contact with the perimeter of an electrode according to an embodiment of the present invention. The single cell module 1600 includes a substrate 1610, a second busbar 1620, a bottom electrode 1630, one or more photovoltaic material layers 1640, a top electrode 1650, and a first busbar 1660. In some embodiments the first busbar 1660 and the second busbar 1620 form a contact around the full module perimeter on the top electrode 1650 and the bottom electrode 1610, respectively. In some embodiments with a 4-sided module, the full module perimeter can be divided into four quadrants with the first busbar 1660 and the second busbar 1620 forming contacts in each of the four quadrants. In some embodiments, to maximize edge contact, the second busbar 1620 can fully contact the bottom electrode 1610 around the full module perimeter (all 4 sides) and the first busbar 1660 can fully contact the top electrode 1650 around the full module perimeter (all 4 sides). To avoid electrical contact between the first busbar 1660 and second busbars 1620, an insulating layer covering the second busbar 1620 can be patterned anywhere the top electrode 1650 or first busbar 1660 overlaps the second busbar.

Figures 16B, 16C:
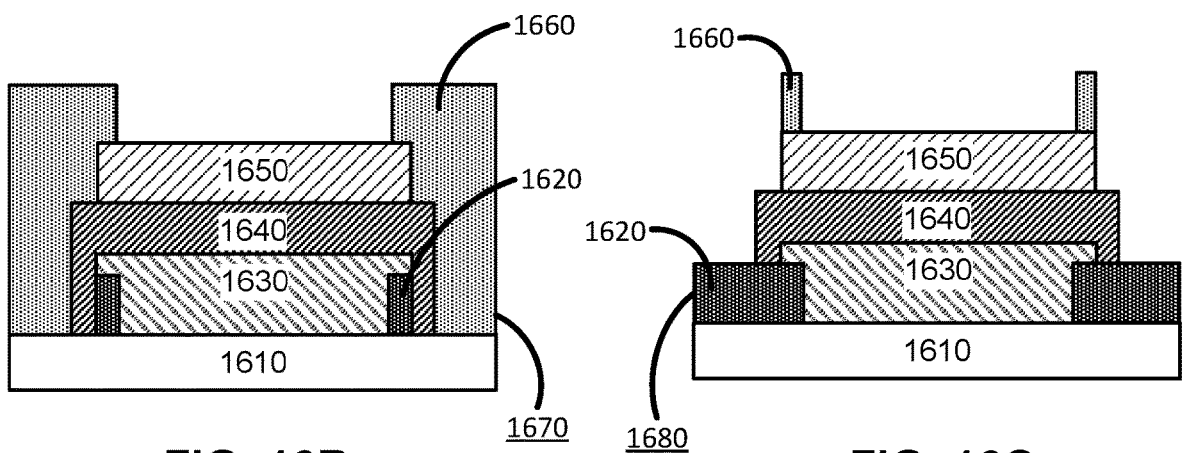
FIG. 16B is a first cross-sectional view of a single cell module with busbars in contact with the perimeter of an electrode according to an embodiment of the present invention.
FIG. 16C is a second cross-sectional view of a single cell module with busbars in contact with the perimeter of an electrode according to an embodiment of the present invention.

FIG. 16B is a first cross-sectional view of a single cell module with busbars in contact with the perimeter of an electrode according to an embodiment of the present invention. FIG. 16C is a second cross-sectional view of a single cell module with busbars in contact with the perimeter of an electrode according to an embodiment of the present invention. FIG. 16B is a cross section that corresponds to line 16B in FIG. 16A. FIG. 16C is a cross section that corresponds to line 16C in FIG. 16A.

In some embodiments, the one or more photovoltaic material layers 1640 and optional buffer materials can serve as an isolating buffer between the top electrode 1650 and the bottom electrode 1610 where they overlap. The one or more photovoltaic material layers 1640 and optional buffer materials can also be used to isolate the first busbar 1660 layer and second busbar 1620 layer. FIG. 16B shows the first busbar 1660 in electrical contact with the top electrode 1650 and extending to a first edge 1670 of the module. The first busbar 1660 is isolated from the bottom electrode and bottom busbar 1660 by the photovoltaic material layer 1640. FIG. 16C shows the second busbar 1620 in electrical contact with the bottom electrode 1610 and extending to a second edge 1680 of the module. The second busbar 1620 is isolated from the top electrode 1650 and the first busbar 1660 by the photovoltaic material layer 1640. In some embodiments, an additional insulating layer (not shown) can be deposited over the bottom busbar 1620 to serve as an insulator to isolate the bottom busbar 1620 from electrical contact with the top electrode 1650 or top busbar 1660.

As described above, one method for reducing the power loss caused by the resistance of the electrode layer is to use a busbar that can provide contact with an electrode layer around the full module perimeter. To maximize edge contact, a bottom busbar can be configured to contact the bottom electrode around the full module perimeter (i.e., all 4 sides) and a top busbar can be configured to fully contact the top electrode around the full module perimeter (i.e., all 4 sides). In other implementations, in order to avoid electrical contact between the bottom busbar (and the bottom electrode) and the top busbar (and the top electrode), a cutout area in the bottom busbar (and the bottom electrode) and/or the top busbar (and the top electrode) can be used for connecting the top busbar and/or the bottom busbar to contact pads of the single cell module.

Figure 17A:
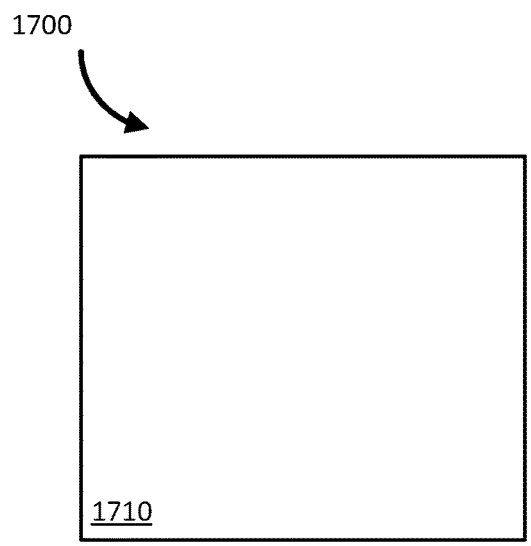
FIGS. 17A-F show a breakout of each layer of a single cell module with busbars in contact with the perimeter of an electrode according to an embodiment of the present invention.
Figure 17B:
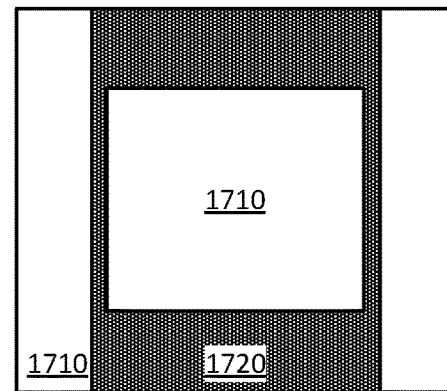

FIGS. 17A-17F show a breakout of each layer of a single cell module with busbars in contact with the perimeter of an electrode. FIG. 17A shows a single cell module 1700 that can include a substrate layer 1710. In some embodiments, the substrate layer 1710 can include one or more electrode pads, including one or more bottom electrode pads and/or one or more isolated electrode pads that are electrically isolated from the bottom electrode pads. FIG. 17B shows a first busbar layer 1720 that can be coupled to the substrate layer 1710. In some embodiments, the first busbar layer can have an opening or void formed therein.

Figure 17C:
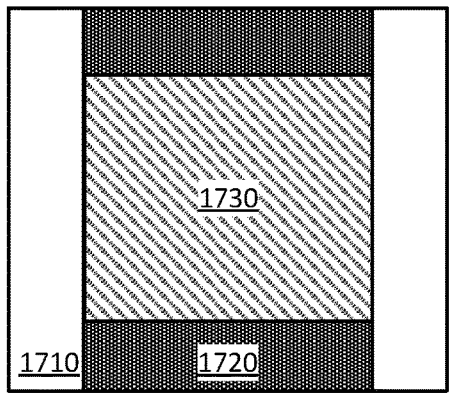
Figure 17D:
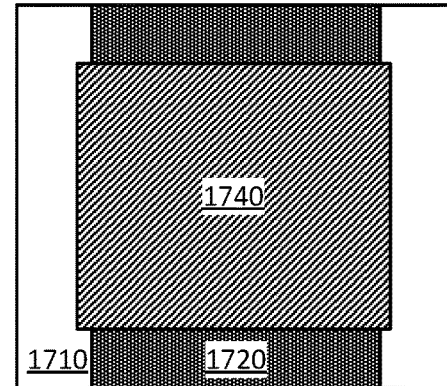

FIG. 17C shows a first electrode layer 1730 that can be fabricated in the opening or void of the first busbar layer. In some embodiments, the first electrode layer 1730 can be an opaque electrode layer, a transparent electrode layer, or some combination thereof. In other embodiments, an insulating material can be formed around the perimeter of the first electrode layer 1730. FIG. 17D show one or more photovoltaic material layers 1740 that can be coupled to one or more of the substrate layer 1710, the first busbar layer 1720, and first electrode layer. In some embodiments, the one or more photovoltaic material layers 1740 can be conventional photovoltaic materials, organic photovoltaic materials, or some combination thereof. In some embodiments, the one or more photovoltaic material layers 1740 can be transparent.

Figure 17E:
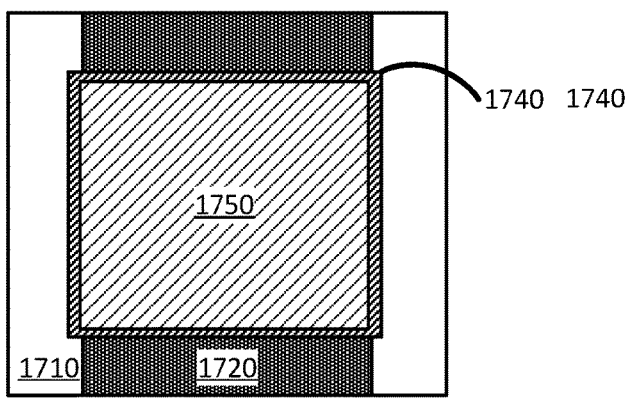
Figure 17F:
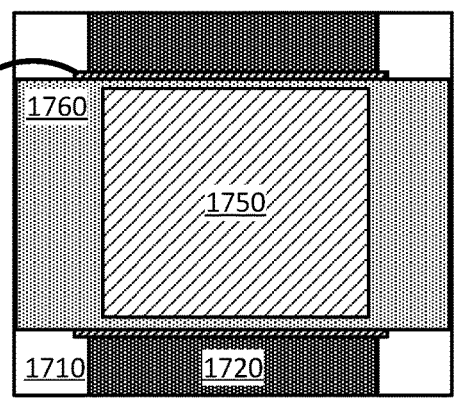

FIG. 17E shows a second electrode layer 1750 that can be coupled to the one or more photovoltaic material layers 1740. The second electrode layer 1750 can be an opaque electrode layer, a transparent electrode layer, or some combination thereof. FIG. 17F shows a second busbar layer 1760 that can be coupled to the second electrode layer 1750. In some embodiments, The optional insulator and the one or more photovoltaic material layers 1740 can electrically isolate the second busbar layer 1760 and second electrode layer 1750 from the first busbar layer 1720 and the first electrode layer 1730. It should be appreciated that the specific layers described in FIGS. 17A-17F provide a particular embodiment for forming a transparent photovoltaic single cell module. One of ordinary skill in the art would recognize many variations, modifications, and alternatives.

Figure 17G:
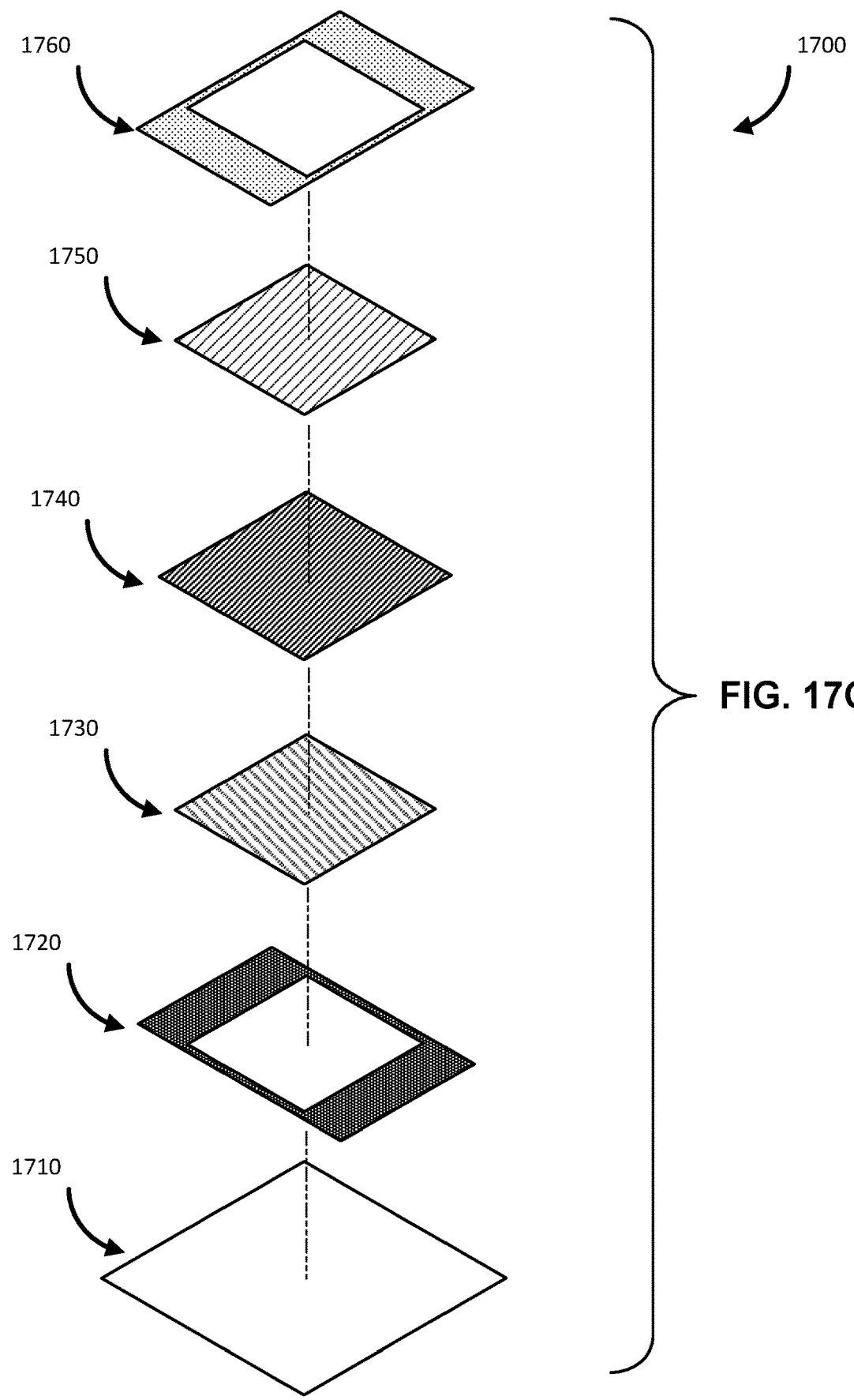
FIG. 17G shows an exploded view of a single cell module with the busbars in contact with the perimeter of an electrode according to an embodiment of the present invention.

FIG. 17G shows an exploded view of a single cell module with the busbars in contact with the perimeter of an electrode. The single cell module 1700 includes a substrate layer 1710, a first busbar layer 1720, a first electrode layer 1730, one or more photovoltaic material layers 1740, a second electrode layer 1750, and a second busbar layer 1760. It should be appreciated that the specific layers illustrated in FIG. 17G provide a particular arrangement of a single cell module with busbars in contact with the perimeter of an electrode according to an embodiment of the present invention. Other layers or contacts can also be formed thereon according to alternative embodiments. Moreover, the individual module layers and components illustrated in FIG. 17G can include multiple sub-layers that can be formed and/or fabricated in various arrangements as appropriate to the individual module. Furthermore, additional layers or components can be added or existing layers or components can be removed depending on the particular applications. One of ordinary skill in the art would recognize many variations, modifications, and alternatives.

FIGS. 18A-18J show a breakout of each layer of an example single cell module with busbars providing near full perimeter contact with an electrode layer according to an embodiment of the present invention. The single cell module 1800 can include a bottom electrode layer 1810, a bottom busbar layer 1820, an active layer 1830, a top electrode layer 1840, and a top busbar layer 1850. As discussed above, or purposes of clarity, references herein utilize the bottom/top nomenclature in reference to various figures, but it will be appreciated that alternative fabrication processes and cell designs can be utilized in which first/second or right/left nomenclature could be appropriate.

FIG. 18A shows a bottom electrode layer 1810 that can include a transparent, electrical conductive material layer, such as an indium tin oxide (ITO), aluminum zinc oxide (AZO), antimony tin oxide (ATO), fluorine tin oxide (FTO), indium zinc oxide (IZO) layer, or thin metal layers such as aluminum, silver, gold or the like (4 nm-12 nm) coupled with organic (e.g., small molecules) or inorganic dielectric layers (e.g. metal oxides). Bottom electrode layer 1810 can include a bottom electrode 1812, where bottom electrode 1812 can include a contiguous central area and a number of extended areas 1814 extending beyond an central transparent area of single cell module 1800. In some embodiments, extended areas 1814 can extend to a first set of electrical contact points 1860 of single cell module 1800. FIG. 18B shows a manufactured bottom electrode layer by a partial single cell module 1815.

FIG. 18C shows a bottom busbar 1820 that can be formed on bottom electrode layer 1810 or at least partially within bottom electrode layer 1810. Bottom busbar 1820 can be implemented as a C-shaped bottom busbar 1822, which can include a cutout area 1824 and one or more extended areas 1826. Extended area(s) 1826 can be used to connect bottom busbar 1822 and bottom electrode 1812 to electrode pads (not shown) of single cell module 1800. Cutout area 1824 can be used for connecting top electrode layer 1840 to contact pads at the bottom of single cell module 1800 such that electrical contact between bottom busbar 1822 (and bottom electrode 1812) and the top busbar (and the top electrode) can be avoided. FIG. 18D shows a second partial single cell module 1825 including the bottom busbar 1820 formed on or at least partially within bottom electrode layer 1810.

FIG. 18E shows an active layer 1830 that can be formed on bottom electrode layer 1810 and/or bottom busbar layer 1820, and can include one or more photovoltaic material layers as described above, such as a cadmium telluride (CdTe) material layer, a silicon material layer, or a layer of another material that exhibits photoelectric effects. Active layer 1830 can include an area 1832 that can at least partially cover the C-shaped portion of bottom busbar 1822 to act as an isolation layer between the top electrode (and the top busbar) and bottom electrode 1812 (and bottom busbar 1822). FIG. 18F shows a third partial single cell module 1835 including the active layer 1830 formed on bottom electrode layer 1810, and bottom busbar 1820 formed on or at least partially within bottom electrode layer 1810.

FIG. 18G shows a top electrode layer 1840 that can be formed on a side of active layer 1830 opposite to bottom electrode layer 1810. Top electrode layer 1840 can include a top electrode 1842 that can include a contiguous central area located at the active region of single cell module 1800. In some implementations, top electrode 1842 can include one or more extended areas 1844 extending beyond the active region of single cell module 1800. Extended areas 1844 can be used for connecting top electrode 1842 to contact pads at the bottom of single cell module 1800. FIG. 18H shows a fourth partial single cell module 1845 including the top electrode layer 1840 formed on top of active layer 1830, which can be formed on bottom electrode layer 1810.

FIG. 18I shows a top busbar layer 1850 that can be formed on or at least partially within top electrode layer 1840. Top busbar layer 1850 can include a top busbar 1852. In some implementations, top busbar 1852 can include a C-shaped area and can include a cutout area 1854. Cutout area 1854 can align with extended area 1826 on bottom bus bar 1822. In some implementations, top busbar 1852 can include an annular-shaped area with no cutout region. Top busbar 1852 can include one or more extended areas 1856. Extended area(s) 1856 can align with cutout area 1824 on bottom bus bar 1822. Extended area(s) 1856 can be used to connect top busbar 1852 to contact pads at the bottom of single cell module 1800. FIG. 18J shows a manufactured single cell module 1845 including aligned layers of bottom electrode layer 1810, bottom busbar layer 1820, active layer 1830, top electrode layer 1840, and top busbar layer 1850.

Figure 18K:
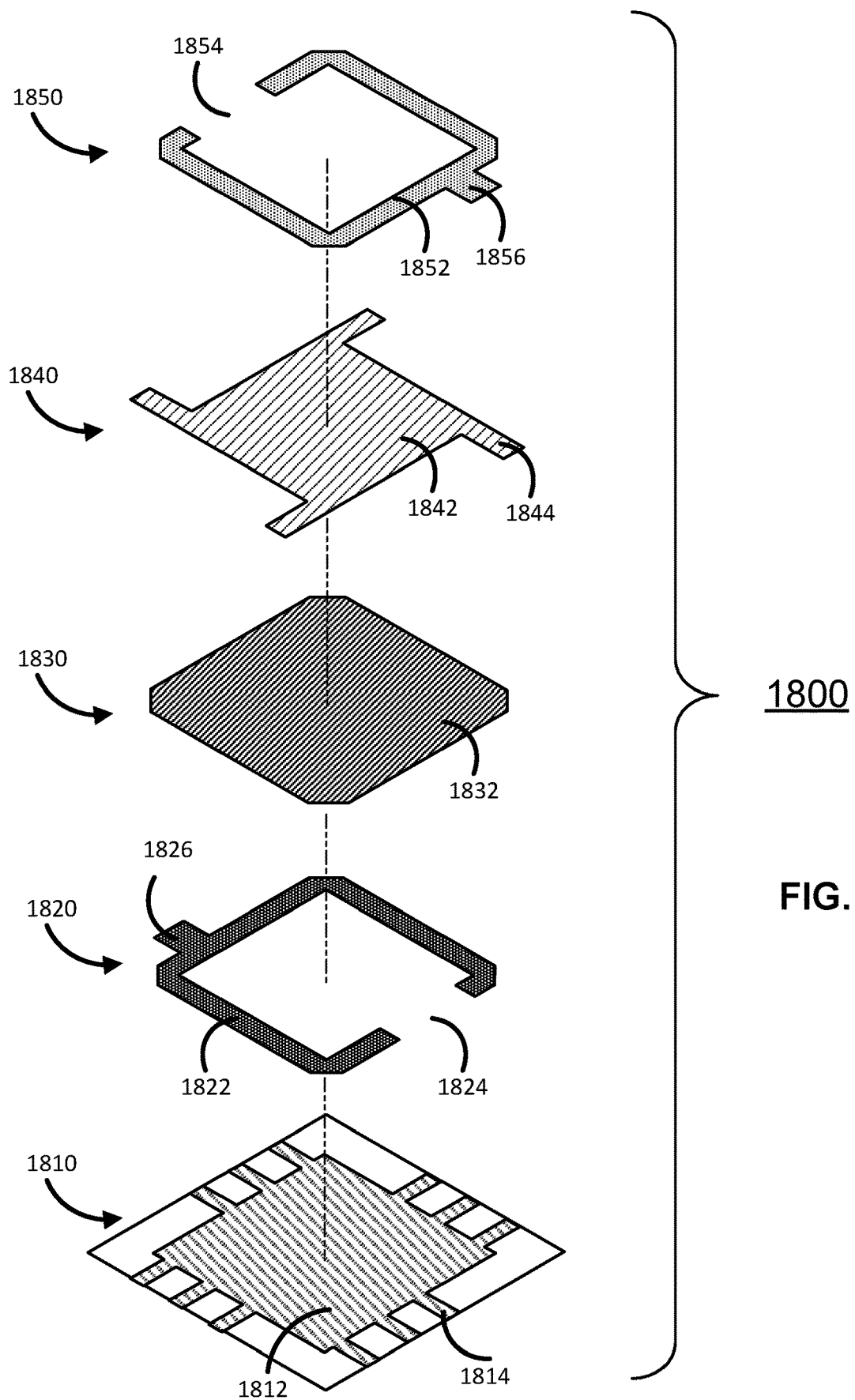
FIG. 18K is an exploded view of an example single cell module with busbars providing near full perimeter contact with an electrode layer according to an embodiment of the present invention.

FIG. 18K is an exploded view of the example single cell module 1800 with busbars providing near full perimeter contact with an electrode layer. As described above, single cell module 1800 can include aligned layers of bottom electrode layer 1810, bottom busbar layer 1820, active layer 1830, top electrode layer 1840, and top busbar layer 1850. Bottom electrode layer 1810 can be formed on a substrate. In the example shown in FIG. 18B, bottom busbar 1822 can be formed on top of bottom electrode layer 1810. In some implementations, bottom busbar 1822 can be formed on the bottom surface of bottom electrode layer 1810 or formed at least partially within bottom electrode layer 1810. Active layer 1830 can be formed on top of bottom electrode 1812 or bottom busbar 1822. Top electrode 1842 can be formed on active layer 1830, which can isolate top electrode 1842 and bottom electrode 1812. Top busbar 1852 can be formed on top of top electrode 1842.

In some embodiments, in addition to or as an alternative to reducing the resistance of the electrode layer, a multi junction cell module can be used to improve the efficiency of the single cell module by increasing the output voltage of the single cell module while limiting the output current of the single cell module. As discussed above, operating at low current can help further reduce resistive power losses.

Figure 19:
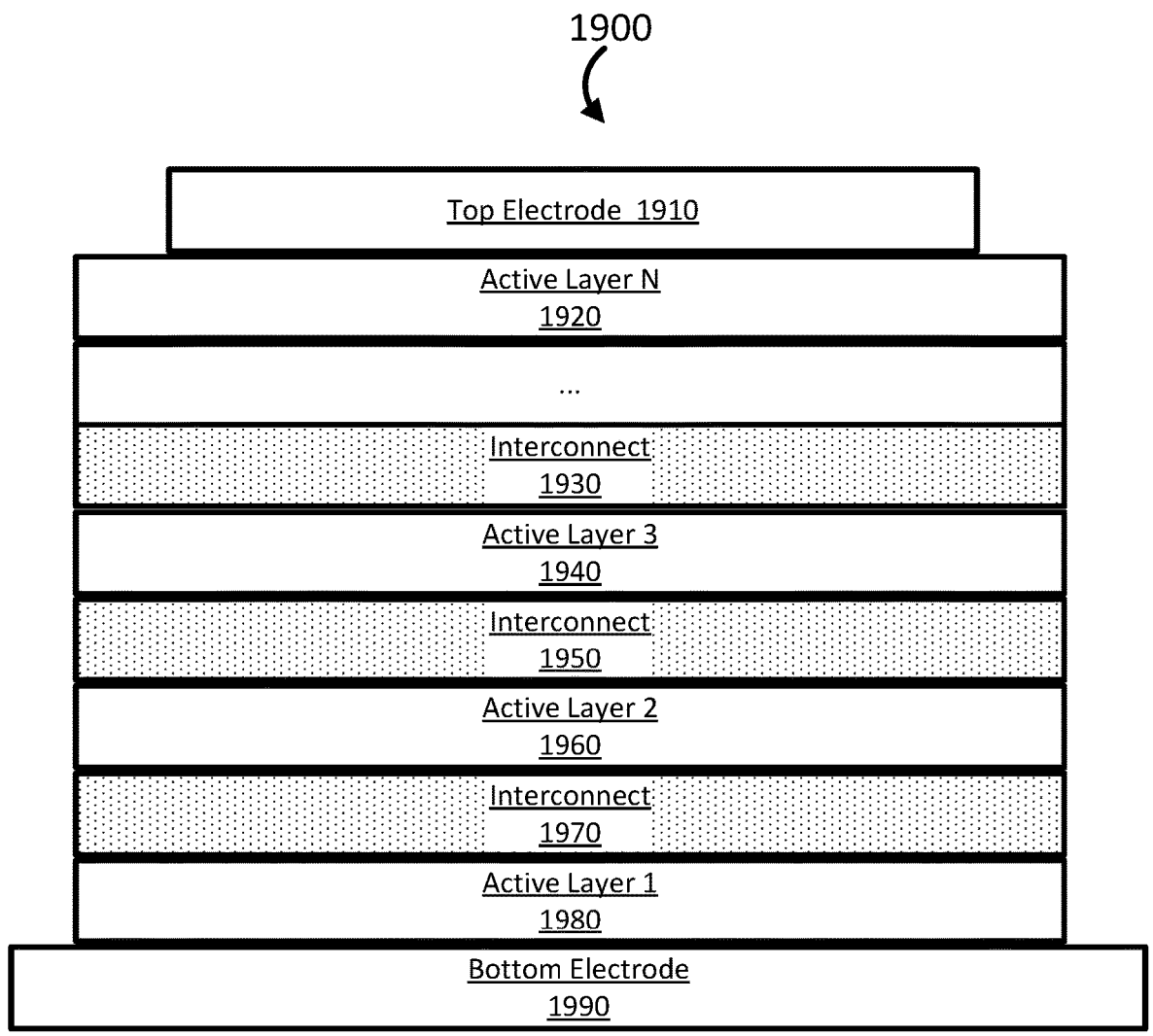
FIG. 19 is a cross-sectional view illustrating an example multi junction cell module according to an embodiment of the present invention.

FIG. 19 is a cross-sectional view illustrating an example multi junction cell module according to an embodiment of the present invention. Multi junction cell module 1900 can include multiple junctions (or active layers) connected in series by interconnects between adjacent junctions (or active layers) to form a tandem structure. As shown in FIG. 19, multi-junction cell module 1900 can include active layer 1 (1980), active layer 2 (1960), active layer 3 (1940), . . . , and active layer N (1920). The active layers can be connected in series by corresponding interconnect layers 1970, 1950, 1930, etc. A top electrode layer 1910 can be formed on active layer N (1920), and a bottom electrode layer 1990 can be in contact with active layer 1 (1980). Each active layer and adjacent interconnect layers (or top electrode layer 1910 and bottom electrode layer 1990) can form a subcell.

In multi junction cell module 1900, the current generated in each subcell can flow in series to the electrodes. For example, in some implementations, holes generated in active layer 1 (1980) can recombine with electrons generated in active layer 2 (1960) at interconnect layer 1970. Holes generated in active layer 2 (1960) can recombine with electrons generated in active layer 3 (1940), and so on. As such, only holes from active layer N (1920) and electrons from active layer 1 (1980) can be collected at the respective electrodes to generate photocurrent. In some other implementations, the active layers and the electrodes can be configured such that only holes from active layer 1 (1980) and electrons from the active layer N (1920) can be collected at the respective electrodes to generate photocurrent. The net output current in multi-junction cell module 1900 can be limited by the subcell that generates the smallest current among all subcells. The output voltage of multi junction cell module 1900 can be equal to the sum of the open-circuit voltages of the subcells because the subcells are connected in series. For a multi junction cell having N subcells made with same active layers, the net short-circuit current generated by the multi junction cell is approximately ($J_{SC,single\ cell}$/N), and the net open-circuit voltage generated by the multi junction cell is approximately ($V_{OC,single\ cell} \times N$), where $J_{SC,single\ cell}$ is the net short-circuit current of a single-junction cell and $V_{OC,single\ cell}$ is the open-circuit voltage of a single junction cell. Because the net current is reduced by a factor of N, the power loss due to the resistance of the electrode (even if unchanged) can be reduced by a factor of N as well. Thus, the overall efficiency of the multi junction cell can be improved compared with a single-junction cell.

A multi junction cell is also more effective for area scaling than a single junction cell because the multi junction cell can have a lower current density at maximum power point ($J_{MP}$) and a larger voltage at the maximum power point ($V_{MP}$) compared with the single-junction cell. Because power loss is directly proportional to $J_{MP}$ and inversely proportional to $V_{MP}$, decreasing $J_{MP}$ and increasing $V_{MP}$ can decrease the power loss in multi junction cells.

Figures 20A, 20B, 20C, 20D, 20E:
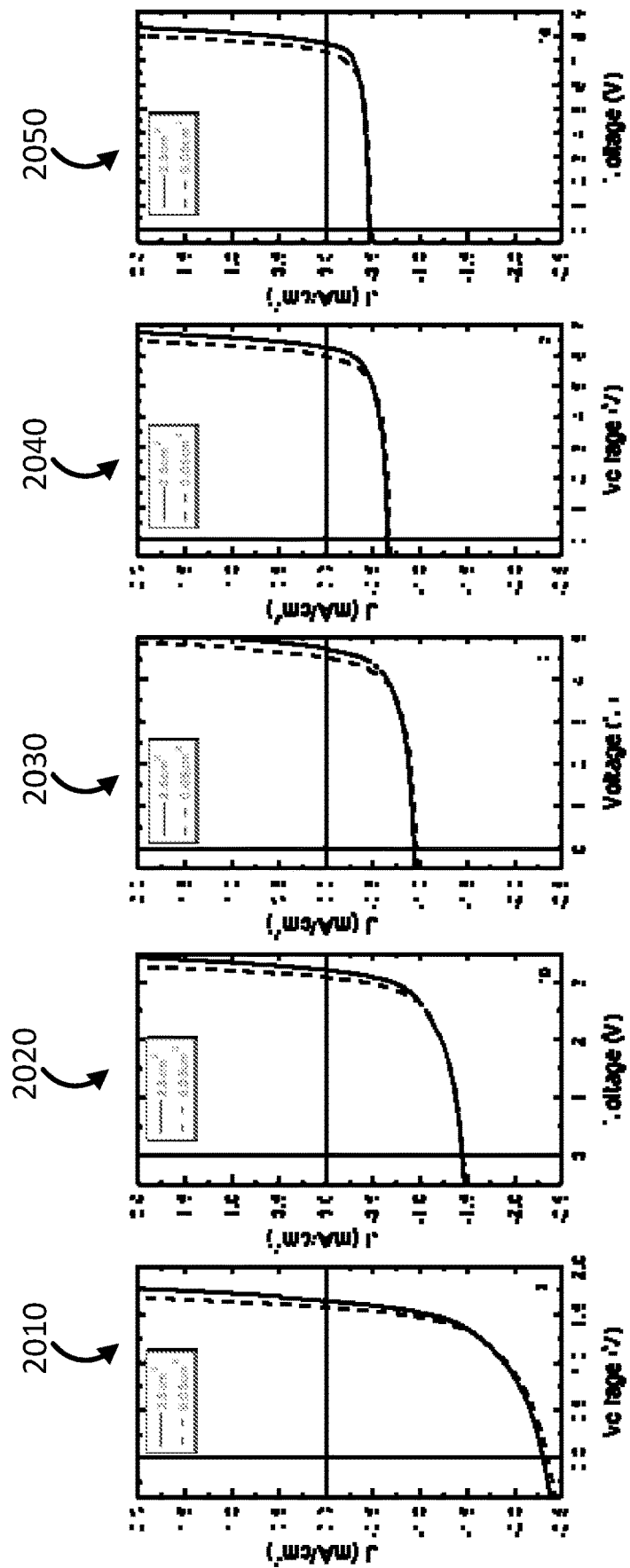
FIGS. 20A-20E illustrate current-density versus voltage plots for example multi-junction cell modules with different numbers of junctions and cell areas.

FIGS. 20A-20E illustrate current-density versus voltage plots for example multi-junction cell modules with different numbers of junctions and cell areas. FIG. 20A is a plot 2010 showing the relationship between the voltage and the current density for a two-junction cell with an active area of about 0.05 cm² and a two-junction cell with an active area of about 2.5 cm². FIG. 20B is a plot 2020 showing the relationship between the voltage and the current density for a four-junction cell with an active area of about 0.05 cm² and a four-junction cell with an active area of about 2.5 cm². FIG. 20C is a plot 2030 showing the relationship between the voltage and the current density for a six-junction cell with an active area of about 0.05 cm² and a six-junction cell with an active area of about 2.5 cm². FIG. 20D is a plot 2040 showing the relationship between the voltage and the current density for an eight-junction cell with an active area of about 0.05 cm² and an eight-junction cell with an active area of about 2.5 cm². FIG. 20E is a plot 2050 showing the relationship between the voltage and the current density for a ten-junction cell with an active area of about 0.05 cm² and a ten-junction cell with an active area of about 2.5 cm².

FIG. 20F is a table 2060 showing performance parameters of the example multi-junction cell modules with different numbers of junctions and cell areas described above with respect to FIGS. 20A-20E. As described above, power loss is generally directly proportional to the current produced and inversely proportional to the voltage produced. As shown by FIGS. 20A-20F, increasing the number of junctions can decrease the total current extracted from the cell and increase the voltage as shown in FIG. 20F. Thus, the power loss of the multi junction cell can decrease with the increase in the number of junctions, and, with more junctions, the average efficiency of a multi junction cell with a larger active area can be closer to the average efficiency of a multi junction cell with a smaller active area. FIG. 20F shows that an area scaling factor above 95% can be achieved across all junctions, and can increase with increasing number of junctions.

In addition to reducing power loss, a multi junction cell can provide other benefits. Many battery charging applications use input voltages of 3.3 V, 5 V, or even higher voltages. Multi junction cells can allow the output voltage of the single cell module to reach these higher voltages. For example, a single-junction cell can have an output voltage less than 1 V (e.g., about 0.8 V). By combining multiple junctions in series, the overall voltage can be much higher, such as 10 V or higher.

The output voltage from a module can be modulated using buck or boost converters (or other types of regulators) that either down-regulate or boost up the voltage to match the input voltage of an application circuit. With any regulation (either voltage up or down), there may be a power loss and thus an efficiency decrease. Stepping down in voltage is generally more efficient than stepping up in voltage, as the stepping-down regulators may not use as many components as the stepping-up regulators. Therefore, it may be desirable to tune the module to match the output voltage of the module with the input voltage of the given application. In some implementations, the number of junctions can be altered to change the output voltage for different applications. In some implementations, the layer stack structure rather than the number of cells can be adjusted to vary the output voltage of the module such that no patterning or any other module geometry changes may be needed in order to generate the different output voltage levels.

Figure 21:
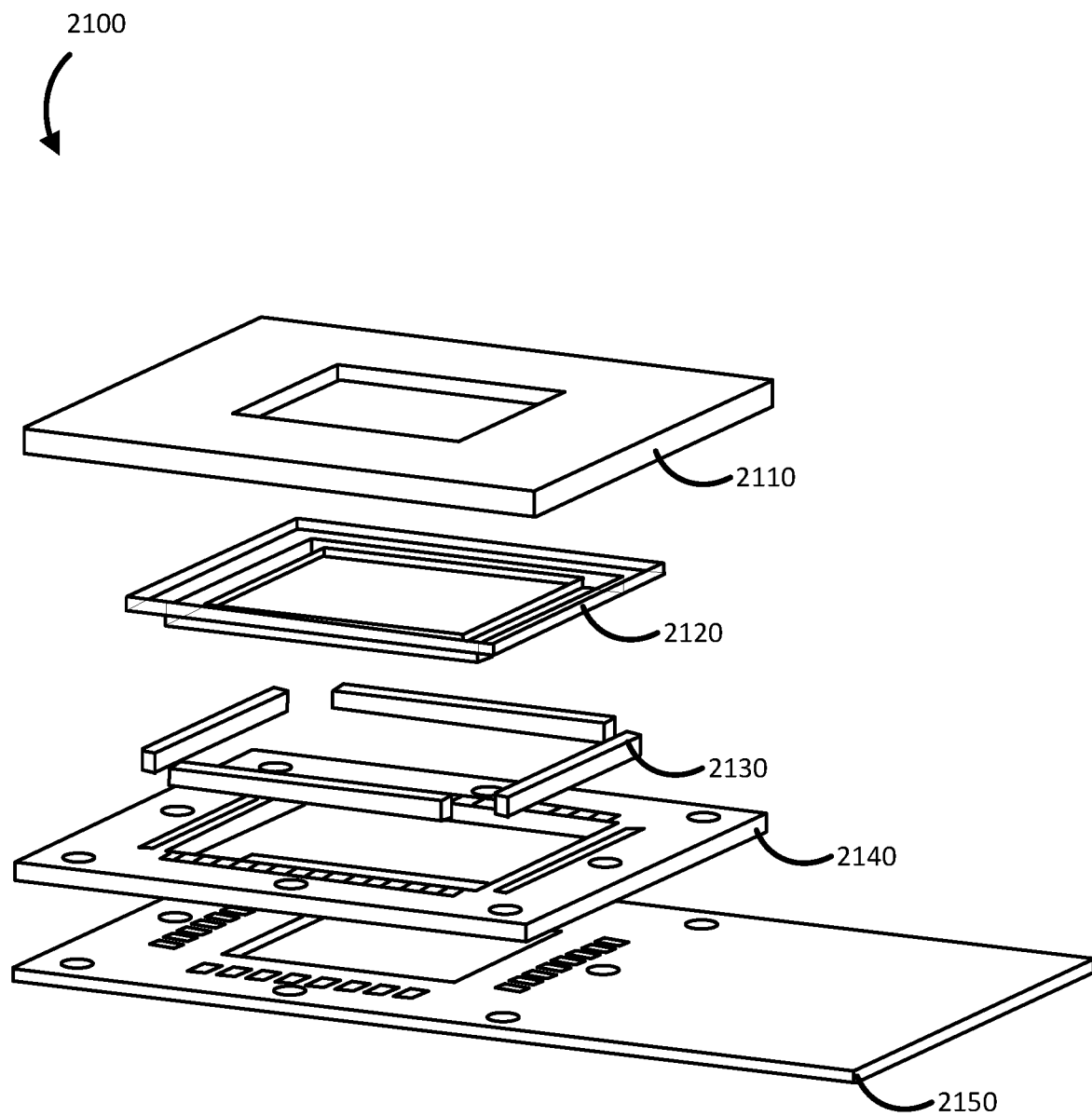
FIG. 21 is an exploded view illustrating a fixture assembly configured to interface with a single cell module as described herein.

FIG. 21 is an exploded view illustrating a fixture assembly configured to interface with a single cell module as described herein. In some embodiments, a fixture assembly 2100 can include a top fixture 2110, an encapsulated single cell module 2120, one or more connectors 2130, a bottom fixture 2140, and/or a printed circuit board (PCB) 2150 to integrate the single cell module with other modules and or devices. In some embodiments, the one or more connectors 2130 can include one or more wires or other conductive materials can be soldered or clamped to the encapsulated single cell module 2120 at each contact point. In some embodiments the one or more connectors 2130 can include ZEBRA® connectors that press and make contact with the electrode contacts on the glass and on the other side are connected to the printed circuit board (PCB) 2150 that combines all the contacts from each electrode to feed out 2 contact points (1 for the anode and 1 for the cathode). The 2 output contacts can then be connected however desired for testing or to a load to power. In some embodiments, the one or more connectors can also be implemented using elastomeric electronic connectors (registered trademark ZEBRA connectors), which consist of alternating conductive and insulating regions in a rubber or elastomer matrix. These connectors, when compressed in a rigid fixture, can make a good electrical contact to the interdigitated contacts of the encapsulated single cell module 2120 and conduct the charge through to contact pads on the PCB 2150. A fixture assembly can lower resistance caused by interfacing with the single cell module 2120 and minimize power losses from the module output.

It should be appreciated that the specific steps and devices described herein provide a particular method of making a visibly transparent photovoltaic module according to an embodiments of the present invention. Other sequences of steps may also be performed according to alternative embodiments. For example, alternative embodiments of the present invention may perform the steps outlined above in a different order. Moreover, the individual steps and devices described herein may include multiple sub-steps that may be performed in various sequences as appropriate to the individual embodiments. Furthermore, additional steps and components be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A photovoltaic module comprising:
   a first visibly transparent electrode layer;
   a second visibly transparent electrode layer;
   a visibly transparent photovoltaic material layer, the visibly transparent photovoltaic material layer located between the first visibly transparent electrode layer and the second visibly transparent electrode layer, wherein overlapping regions of the first visibly transparent electrode layer, the visibly transparent photovoltaic material layer, and the second visibly transparent electrode layer define a visibly transparent active area of the photovoltaic module that is at least partially transparent to visible light while absorbing ultraviolet light or infrared light;
   a first set of electrode pads coupled to the first visibly transparent electrode layer and extending outward from the visibly transparent active area;
   a second set of electrode pads coupled to the second visibly transparent electrode layer and extending outward from the visibly transparent active area, the second set of electrode pads being substantially parallel to the first set of electrode pads;
   a first set of contact points electrically coupled to the first set of electrode pads at positions outside the visibly transparent active area; and
   a second set of contact points electrically coupled to the second set of electrode pads at positions outside the visibly transparent active area.

2. The photovoltaic module of claim 1, wherein the first set of electrode pads and the second set of electrode pads include electrode pads extending from each side of the visibly transparent active area.

3. The photovoltaic module of claim 1, wherein the visibly transparent active area has a non-rectangular shape.

4. The photovoltaic module of claim 1, wherein the first set of contact points corresponds to one or more first busbars.

5. The photovoltaic module of claim 4, the second set of contact points corresponds to one or more second busbars.

6. The photovoltaic module of claim 1, wherein the first set of contact points corresponds to a first busbar arranged around all or a portion of a perimeter of the visibly transparent active area.

7. The photovoltaic module of claim 6, wherein the first busbar comprises an opaque conductor.

8. The photovoltaic module of claim 6, wherein the second set of contact points corresponds to a second busbar arranged around all or a portion of the perimeter of the visibly transparent active area.

9. The photovoltaic module of claim 1, further comprising a connector electrically coupled to the first set of contact points and the second set of contact points, wherein the connector includes at least one of an elastomeric electronic connector, an anisotropic conductive material, or a PCB.

10. The photovoltaic module of claim 1, wherein the visibly transparent photovoltaic material layer comprises an organic photovoltaic.

11. The photovoltaic module of claim 1, wherein the visibly transparent photovoltaic material layer comprises a plurality of junctions connected in in series.

12. The photovoltaic module of claim 1, wherein the first visibly transparent electrode layer and the second visibly transparent electrode layer independently comprise an indium tin oxide (ITO) layer, a fluorine tin oxide (FTO) layer, an aluminum zinc oxide (AZO) layer, an antimony tin oxide (ATO) layer, an indium zinc oxide (IZO) layer, or a thin metal layer.

13. The photovoltaic module of claim 1, wherein the first visibly transparent electrode layer extends beyond the visibly transparent active area or wherein the second visibly transparent electrode layer extends beyond the visibly transparent active area.

14. A device comprising:
   the photovoltaic module of claim 1; and
   an information display, wherein the visibly transparent active area is positioned over the information display so that at least a portion of the information display is visible through the visibly transparent active area.

* * * * *